US012564109B2

(12) United States Patent
Wu et al.

(10) Patent No.: US 12,564,109 B2
(45) Date of Patent: Feb. 24, 2026

(54) PACKAGE COMPONENT, ELECTRONIC DEVICE AND MANUFACTURING METHOD THEREOF

(71) Applicant: Taiwan Semiconductor Manufacturing Company, Ltd., Hsinchu (TW)

(72) Inventors: Chih-Wei Wu, Yilan County (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 155 days.

(21) Appl. No.: 18/365,232

(22) Filed: Aug. 4, 2023

(65) Prior Publication Data

US 2023/0378133 A1 Nov. 23, 2023

Related U.S. Application Data

(63) Continuation of application No. 16/805,865, filed on Mar. 2, 2020, now Pat. No. 11,824,040.

(Continued)

(51) Int. Cl.
H01L 25/065 (2023.01)
H01L 21/48 (2006.01)
(Continued)

(52) U.S. Cl.
CPC ...... H01L 25/0655 (2013.01); H01L 21/4857 (2013.01); H01L 21/76898 (2013.01);
(Continued)

(58) Field of Classification Search
CPC ............. H01L 23/5389; H01L 23/5383; H01L 23/5384; H01L 23/49827; H01L 21/4857; H01L 21/76898; H01L 21/6835; H01L 21/568; H01L 25/0655; H01L 25/10–13; H01L 25/50; H01L 2224/08165; H01L 2224/16165; H01L 2224/16235;
(Continued)

(56) References Cited

U.S. PATENT DOCUMENTS 8,993,380 B2    3/2015  Hou et al.
9,281,254 B2    3/2016  Yu et al.
(Continued)

*Primary Examiner* — Lawrence C Tynes, Jr.
(74) *Attorney, Agent, or Firm* — JCIPRNET

(57) ABSTRACT

A package structure includes a first dielectric layer disposed on a first patterned circuit layer, a first conductive via in the first dielectric layer and electrically connected to the first patterned circuit layer, a circuit layer on the first dielectric layer, a second dielectric layer on the first dielectric layer and covering the circuit layer, a second patterned circuit layer on the second dielectric layer and including conductive features, a chip on the conductive features, and a molding layer disposed on the second dielectric layer and encapsulating the chip. The circuit layer includes a plurality of portions separated from each other and including a first portion and a second portion. The number of pads corresponding to the first portion is different from that of pads corresponding to the second portion. An orthographic projection of each portion overlaps orthographic projections of at least two of the conductive features.

20 Claims, 34 Drawing Sheets

Related U.S. Application Data

(60) Provisional application No. 62/906,724, filed on Sep. 27, 2019.

(51) Int. Cl.
| | |
|---|---|
| *H01L 21/768* | (2006.01) |
| *H01L 23/00* | (2006.01) |
| *H01L 23/31* | (2006.01) |
| *H01L 23/538* | (2006.01) |

(52) U.S. Cl.
CPC ...... *H01L 23/3128* (2013.01); *H01L 23/5383* (2013.01); *H01L 23/5384* (2013.01); *H01L 23/5389* (2013.01); *H01L 24/16* (2013.01); *H01L 2224/16227* (2013.01)

(58) Field of Classification Search
CPC . H01L 2224/32165; H01L 2224/32235; H01L 2224/40165; H01L 2224/40235; H01L 2224/48165; H01L 2224/48235; H01L 2224/023–024; H01L 2224/02372; H01L 2225/06548; H01L 2225/10–1094; H01L 24/97; H01L 24/19; H01L 24/20; H01L 24/13; H01L 24/16; H01L 2924/014; H01L 2924/00014; H01L 2924/15311; H01L 2924/19105; H01L 2924/3511; H01L 2221/68318; H01L 2221/68372
See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2017/0263518 A1* | 9/2017 | Yu | H01L 24/83 |
| 2020/0035591 A1* | 1/2020 | Hu | H01L 23/49838 |
| 2020/0058569 A1* | 2/2020 | Cho | H01L 23/49822 |
| 2020/0266136 A1* | 8/2020 | Lee | H01L 23/49589 |
| 2020/0365489 A1* | 11/2020 | Su | H01L 21/566 |

* cited by examiner

PACKAGE COMPONENT, ELECTRONIC DEVICE AND MANUFACTURING METHOD THEREOF

CROSS-REFERENCE TO RELATED APPLICATION

This application is a continuation application of and claims the priority benefit of a prior application Ser. No. 16/805,865, filed on Mar. 2, 2020. The prior application Ser. No. 16/805,865 claims the priority benefit of U.S. provisional application Ser. No. 62/906,724, filed on Sep. 27, 2019. The entirety of each of the above-mentioned patent applications is hereby incorporated by reference herein and made a part of this specification.

BACKGROUND

The semiconductor industry has experienced rapid growth due to continuous improvements in the integration density of a variety of integrated circuit components (e.g., transistors, diodes, resistors, capacitors, etc.). In the packaging of integrated circuit components, semiconductor dies are stacked and bonded to other package components such as interposers and package substrates. As the demand for miniaturization, the increased density and corresponding decrease in area occupied by the integrated circuit components has surpassed the ability to bond the semiconductor die onto the package component. Although existing package component have allowed for a three-dimensional (3D) package that includes multiple semiconductor packages, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
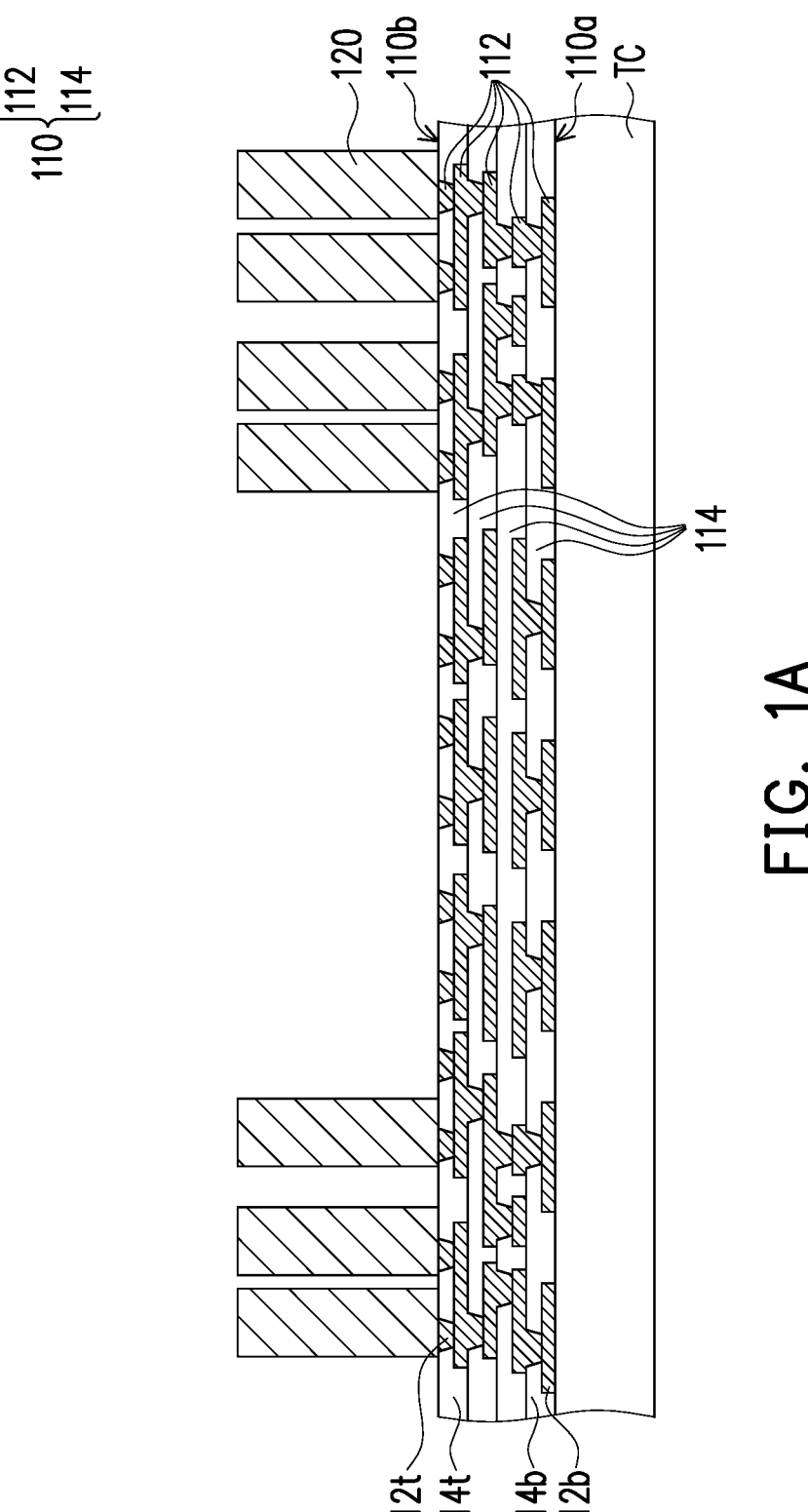
FIG. 1A to FIG. 1G are schematic cross-sectional views of various stages of manufacturing an electronic device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
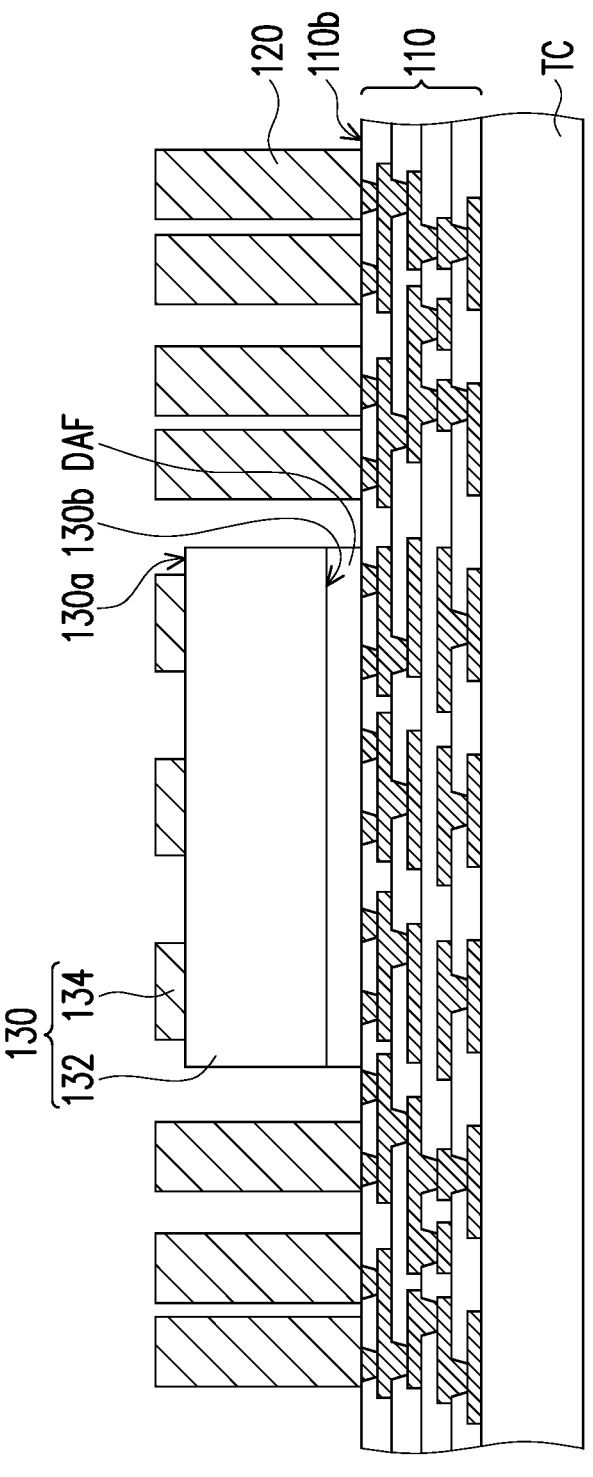
Figure 1C:
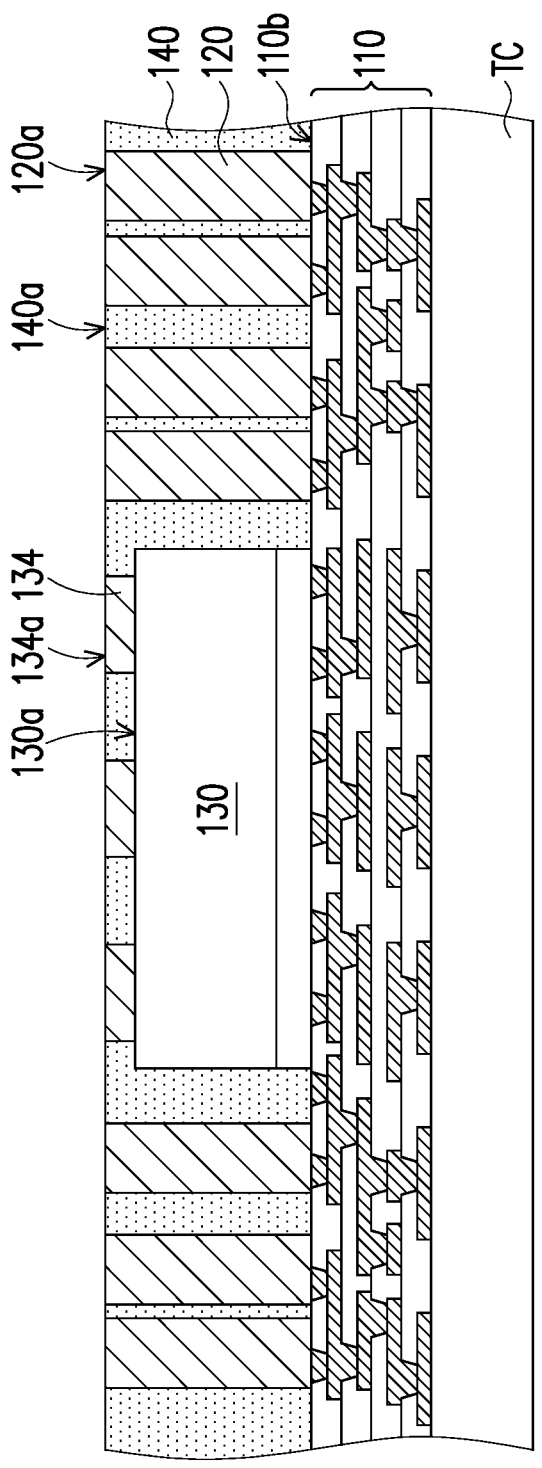
Figure 1D:
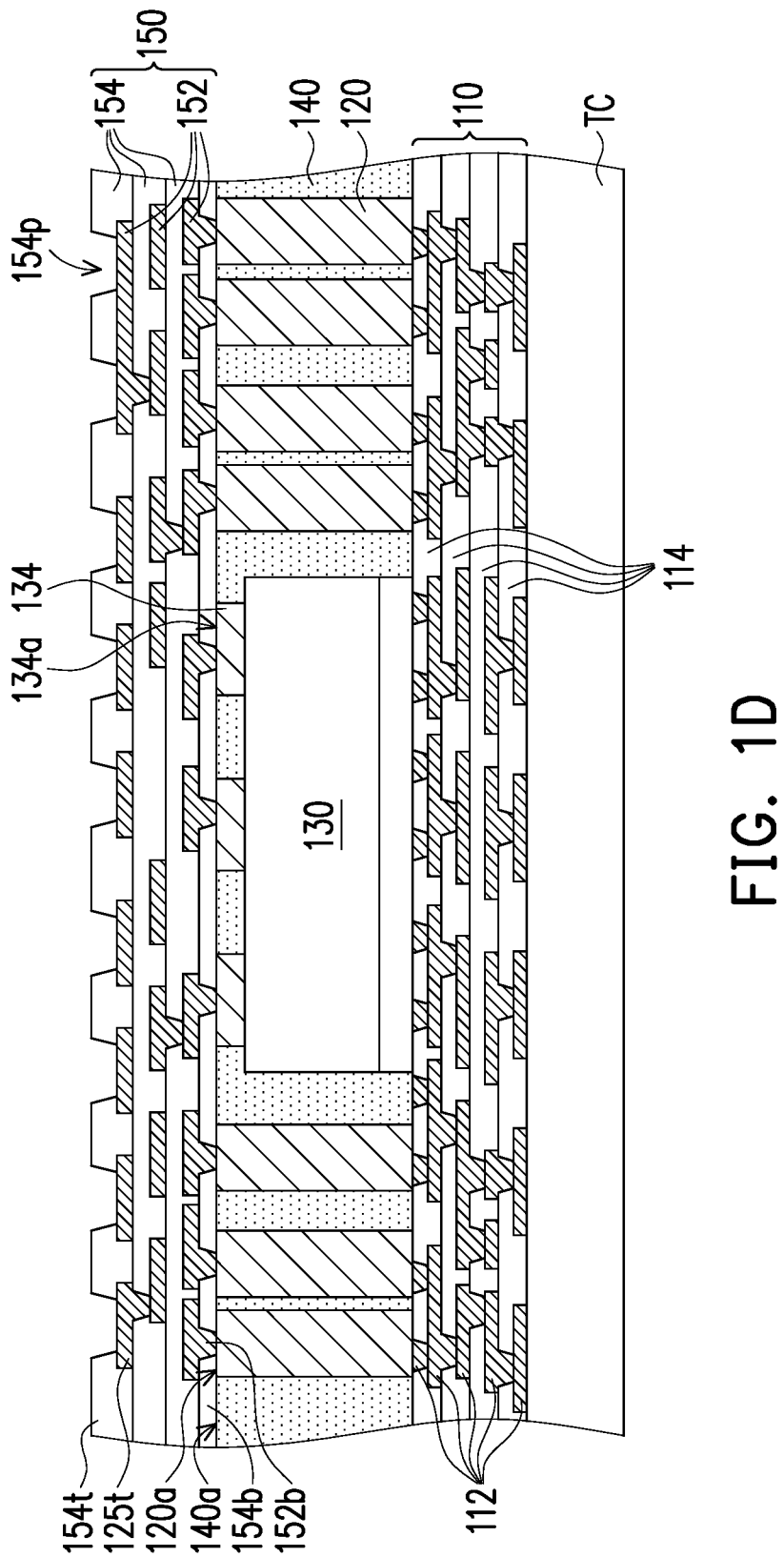
Figure 1E:
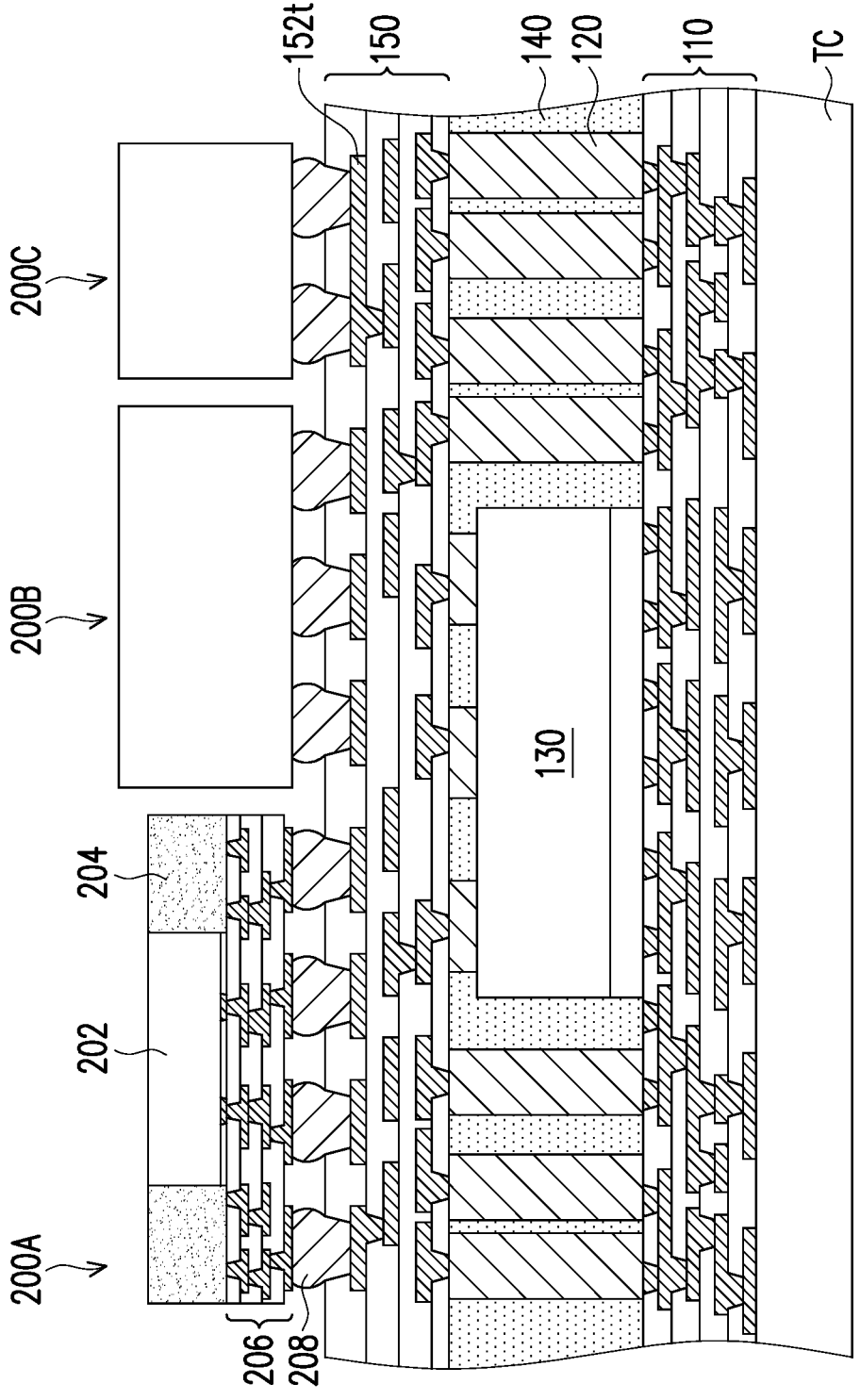
Figure 1F:
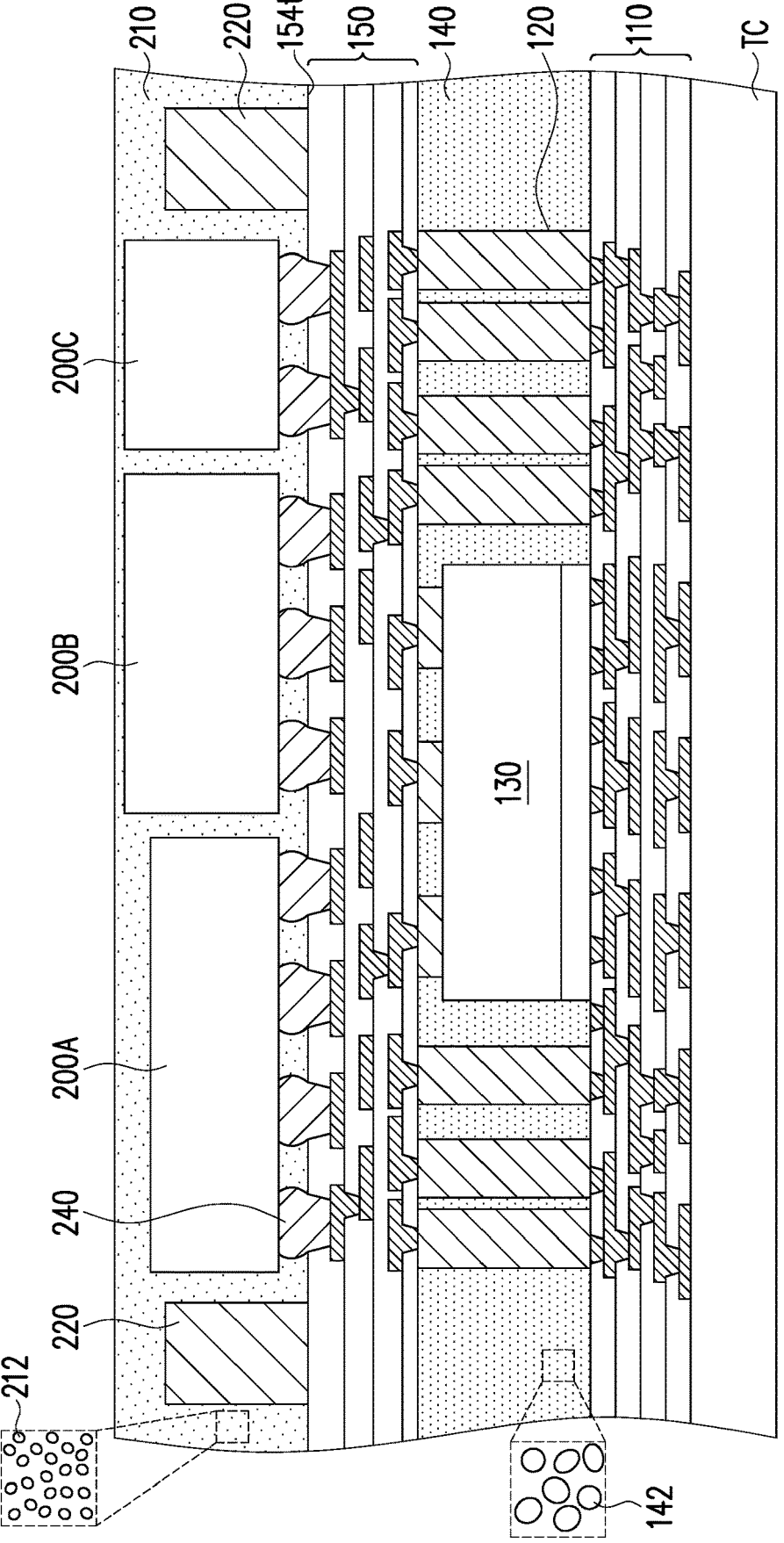
Figure 1G:
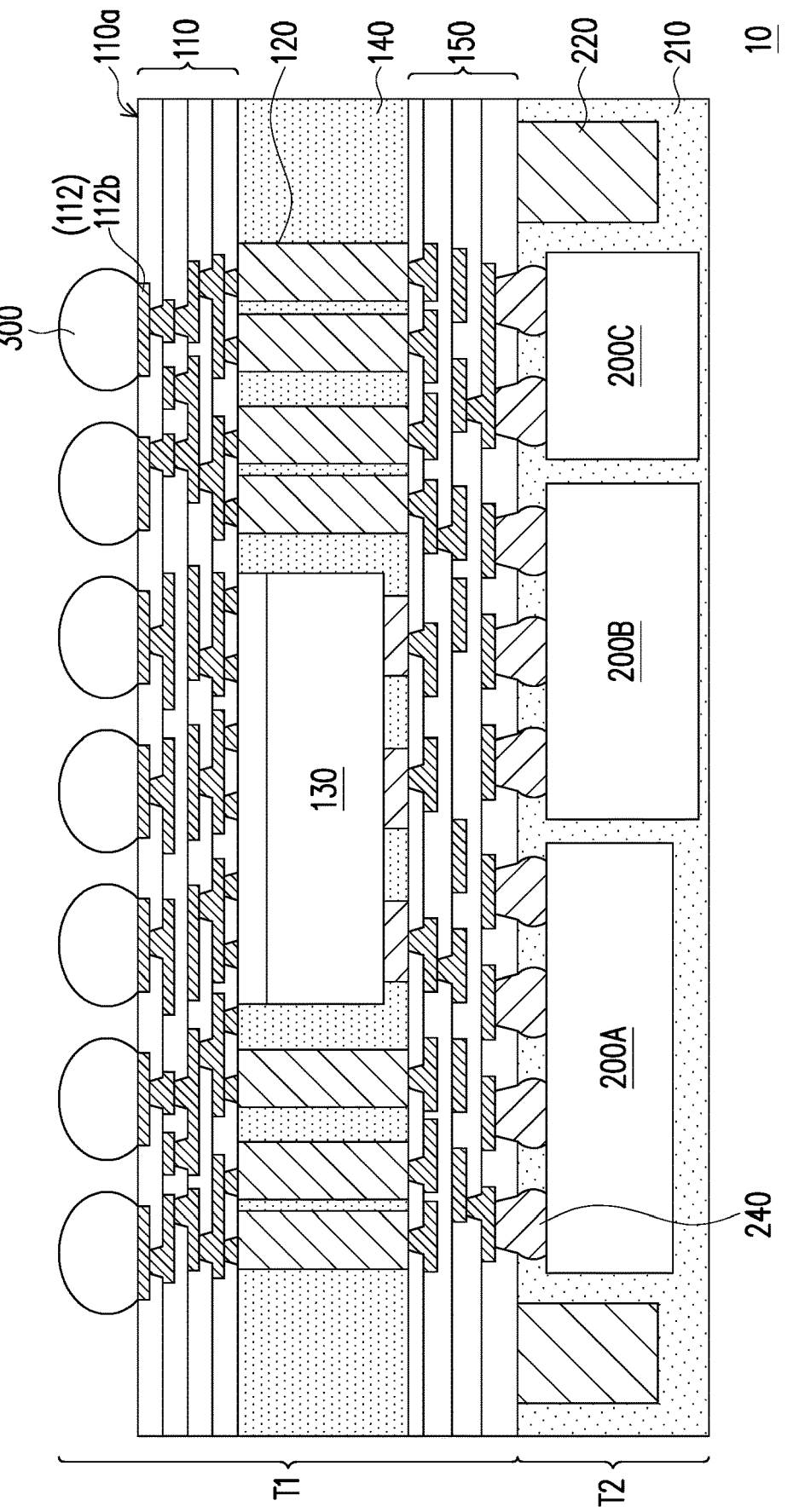
Figure 2:
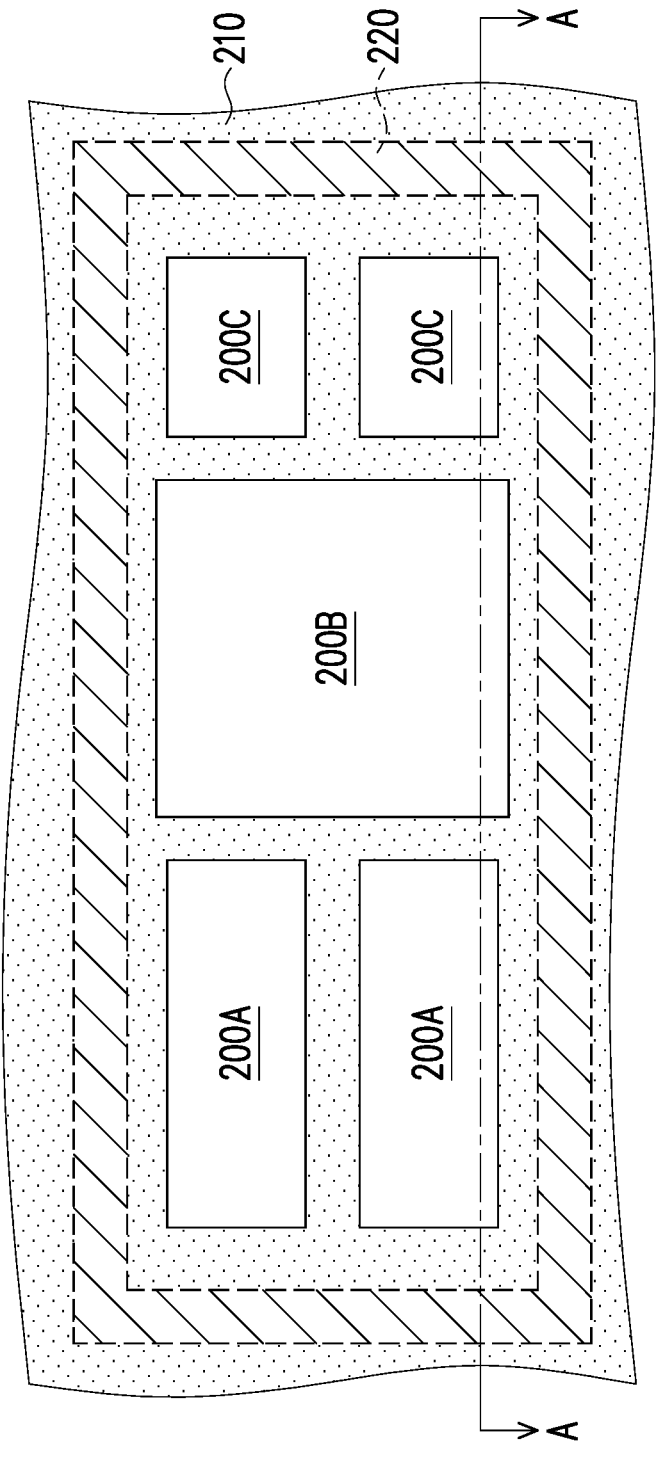
FIG. 2 is a schematic top view of FIG. 1F in accordance with some embodiments of the disclosure.

FIG. 1A to FIG. 1G are schematic cross-sectional views of various stages of manufacturing an electronic device in accordance with some embodiments of the disclosure, and FIG. 2 is a schematic top view of FIG. 1F in accordance with some embodiments of the disclosure. Referring to FIG. 1A, a first redistribution structure 110 is formed over a temporary carrier TC and at least one through interlayer via (TIV) 120 is formed on the first redistribution structure 110. For example, the temporary carrier TC includes metal (e.g., steel), glass, ceramic, silicon (e.g., bulk silicon), combinations thereof, multi-layers thereof, or the like. In some embodiments, a release layer (not shown) is formed on the temporary carrier TC to facilitate releasing the temporary carrier TC from the structure formed thereon in the subsequent process. For example, the release layer includes a layer of light-to-heat-conversion (LTHC) release coating and a layer of associated adhesive (e.g. a ultra-violet curable adhesive or a heat curable adhesive layer), or the like. Alternatively, the release layer is omitted.

In some embodiments, the first redistribution structure 110 includes a first surface 110a and a second surface 110b opposite to each other, where the first surface 110a faces the temporary carrier TC, and the TIVs 120 may be formed on the second surface 110b. For example, the first redistribution structure 110 includes a first dielectric layer 114 and a first patterned conductive layer 112 embedded in the first dielectric layer 114. In some embodiments, one or more layers of dielectric materials are represented collectively as the first dielectric layer 114, and the first patterned conductive layer 112 may be redistribution wirings that include vias, pads and/or traces that form the electrical connections. For example, these redistribution wirings are formed layer by layer and stacked on the layers of dielectric materials alternately. In some embodiments, the first dielectric layer 114 is formed of a polymeric material such as polybenzoxazole (PBO), polyimide (PI), benzocyclobutene (BCB), or other suitable material that can be patterned using lithography. For example, the first dielectric layer 114 is formed using any suitable method, such as a spin-on coating process, a deposition process, and/or the like. In some embodiments, the first patterned conductive layer 112 is formed of conductive material, e.g., copper, titanium, tungsten, aluminum, metal alloy, a combination of these, or the like).

In some embodiments, the formation of the first redistribution structure 110 includes at least the following steps. A seed layer (not shown) may be formed over the temporary carrier TC. For example, the seed layer is a metal layer, which may be a single layer (e.g., copper or copper alloys) or a composite layer including sub-layers formed of different materials (e.g., titanium and copper). A photoresist (not shown) is then formed and patterned on the seed layer in accordance with a desired metallization pattern. A conductive material is formed in the openings of the photoresist and on the exposed portions of the seed layer. Then, the photoresist and portions of the seed layer on which the conductive material is not formed are removed. The remaining portions of the seed layer and conductive material form the bottommost one 112b of the first patterned conductive layer 112. In some embodiments the bottommost one 112b of the first patterned conductive layer 112 includes under bump metallization (UBM) pattern that provides electrical connections to the first redistribution structure 110 upon which electrical connectors (e.g., solder balls/bumps, conductive pillars, or the like) may be placed. After forming the bottommost one 112b of the first patterned conductive layer 112, the bottommost one 114b of the first dielectric layer 114 is formed over the temporary carrier TC to cover the bottommost one 112b of the first patterned conductive layer 112. For example, the dielectric material is formed and patterned to form the bottommost one 114b of the first dielectric layer 114 with openings, where the openings may accessibly expose at least a portion of the bottommost one 112b of the first patterned conductive layer 112.

Additional layers of dielectric material and additional conductive patterns may then be formed on the bottommost one 114b of the first dielectric layer 114 to form additional electrical connections within the first redistribution structure 110. The layers of dielectric material and additional conductive patterns may be formed using similar materials and processes as used to form the bottommost one 114b of the first dielectric layer 114 and the bottommost one 112b of the first patterned conductive layer 112. For example, the above-mentioned steps are performed multiple times to obtain a multi-layered redistribution structure as required by the circuit design. The numbers of the first dielectric layer 114 and the first patterned conductive layer 112 may be selected based on demand and are not limited in the disclosure.

In some embodiments, the first patterned conductive layer 112 is formed before forming the first dielectric layer 114. In some other embodiments, the first dielectric layer 114 is formed prior to the formation of the patterned conductive layer 112. In some embodiments in which the first dielectric layer 114 is formed before forming the first patterned conductive layer 112, the UBM pattern is formed on the first surface 110a after removing the temporary carrier TC and before forming conductive terminals (labeled in FIG. 1G). It should be noted that the forming sequence of the first dielectric layer 114 and the first patterned conductive layer 112 depends on the design requirement and construe no limitation in the disclosure.

Continue to FIG. 1A, in some embodiments, the topmost one 112t of the first patterned conductive layer 112 is formed in the openings of the topmost one 114t of the first dielectric layer 114. For example, the topmost one 112t of the first patterned conductive layer 112 is substantially leveled with the topmost one 114t of the first dielectric layer 114 at the second surface 112b of the first redistribution structure 110. The TIVs 120 formed on the first redistribution structure 110 may be in physical and electrical contact with the topmost one 112t of the first patterned conductive layer 112. In some embodiments, the TIVs 120 may be arranged beside and/or surround the predetermined location of the semiconductor die (130 labeled in FIG. 1B). In some embodiments, the topmost one 112t of the first patterned conductive layer 112 are distributed on a die-attaching region of the topmost one 114t of the first dielectric layer 114 that is surrounded by the TIVs 120. In other embodiments, the die-attaching region of the topmost one 114t of the first dielectric layer 114 is free of the topmost one 112t of the first patterned conductive layer 112.

In some embodiments, the TIVs 120 are formed by forming a photoresist (not shown) on the second surface 110b of the first redistribution structure 110 with openings exposing at least a portion of the first patterned conductive layer 112, forming a metallic material filling the openings to form the TIVs 120 by electroplating or deposition and then removing the photoresist. In some embodiments, the topmost one 112t of the first patterned conductive layer 112 and the TIVs 120 are formed during the same process. In other embodiments, the TIVs 120 are pin-like columns and may be disposed on the second surface 110b of the first redistribution structure 110 via such as a pick-and-place process.

Referring to FIG. 1B, a semiconductor die 130 may be provided and disposed over the first redistribution structure 110. In FIG. 1B, only one semiconductor die 130 is shown as an example, but it is understood that more than one semiconductor dies or different types of semiconductor dies may be included within the electronic device. In some embodiments, the semiconductor die 130 is formed in a device wafer, which may include different die regions that are singulated in subsequent steps to form a plurality of semiconductor dies 130. After singulation, the semiconductor die 130 is placed on the predetermined location by, for example, a pick-and-place process, and may be surrounded by the TIVs 120. In some embodiments, the placement of the semiconductor die 130 is performed after forming the TIVs 120. In other embodiments, the semiconductor die 130 is disposed on the second surface 110b of the first redistribution structure 110 prior to the formation of the TIVs 120.

For example, the semiconductor die 130 includes a semiconductor substrate 132 and a plurality of die connectors 134 distributed over the semiconductor substrate 132. The semiconductor substrate 132 includes a front surface 130a and a back surface 132b opposite to each other. For example, the semiconductor die 130 is attached to the second surface 110b of the first redistribution structure 110 via a die attach film DAF that is disposed on the back surface 130b of the semiconductor die 130 for better adhering the semiconductor die 130 to the first redistribution structure 110. Alternatively, the die attach film DAF is omitted. The die connectors 134 are disposed over the front surface 130a for further electrical connection.

The semiconductor substrate 132 may include a bulk semiconductor substrate, semiconductor-on-insulator (SOI) substrate, multi-layered semiconductor substrate, etc. The semiconductor material of the semiconductor substrate 132 may be silicon, germanium, a compound semiconductor (e.g., silicon carbide, silicon germanium, gallium arsenic, gallium phosphide, indium phosphide, etc.), an alloy semiconductor (e.g., SiGe, GaAsP, AlInAs, AlGaAs, etc.), or combinations thereof. The semiconductor substrate 132 may be doped or undoped. In other embodiments, multi-layered or gradient semiconductor substrates are used. The die connectors 134 may be or may include conductive pads (e.g., aluminum pads, copper pads or other suitable metallic pads) and/or conductive posts (e.g., copper posts or copper alloy posts). It is noted that the illustration of the semiconductor die 130 is simplified and multiple layers and/or components may be included within the semiconductor die 130. For example, the die connectors 134 and the layers (not shown) over the semiconductor substrate 132 and connected to the die connectors 134 are formed in a back end of line (BEOL) process to achieve fine line-spacing requirements.

In some embodiments, the semiconductor die 130 includes integrated passive devices (IPDs). In other embodiments, the semiconductor die 130 includes active component (e.g., transistors or the like) and/or passive components (e.g., resistors, capacitors, inductors, etc.) formed in and/or on the semiconductor substrate 132. For example, the semiconductor die 130 includes one or more types of dies selected from application-specific integrated circuit (ASIC) dies, analog dies, sensor dies, wireless and radio frequency dies, voltage regulator dies or memory dies. In some embodiments, the semiconductor die 130 is a bridge die (e.g., a silicon bridge) that may be free of active components and/or passive components. In other embodiments, the semiconductor die 130 serving as the silicon bridge includes passive components, but no active component is built therein.

Referring to FIG. 1C, a first insulating layer 140 is formed on the second surface 110b of the first redistribution structure 110 to encapsulate the semiconductor die 130 and the TIVs 120. The first insulating layer 140 may be molding compound, molding underfill, epoxy resin, phenolic resins, silicon-containing resins, or the like. In some embodiments, the material of the first insulating layer 140 includes filler particles (not shown). The first insulating layer 140 may be applied by compression molding, transfer molding, or the like. In some embodiments, the first insulating layer 140 is referred to as a molding layer. In some embodiments, the semiconductor die 130 and the TIVs 120 are over-molded by a molding material, and then excess molding material is removed to accessibly reveal the semiconductor die 130 and the TIVs 120. For example, a planarizing process (e.g., grinding, chemical mechanical polishing (CMP), etching, combination of these, etc.) is performed on the molding material until at least a portion of the top surfaces 120a of the TIVs 120 and a portion of the top surfaces 134a of the die connectors 134 of the semiconductor die 130 are accessibly revealed.

After the planarization, the top surfaces 120a of the TIVs 120, the top surface 140a of the first insulating layer 140, and the top surfaces 134a of the die connectors 134 become substantially leveled and flush with one another. In some embodiments, a portion of the first insulating layer 140 is formed on the front surface 130a and laterally covers the die connectors 134. The first insulating layer 140 may extend along the sidewalls of the TIVs 120 and the sidewalls of the semiconductor die 130. In some embodiments, the first insulating layer 140 fills the space between the semiconductor die 130 and the TIVs 120 and at least laterally covers the semiconductor die 130 and the TIVs 120 over the first redistribution structure 110.

Referring to FIG. 1D, a second redistribution structure 150 is formed on the first insulating layer 140, the semiconductor die 130, and the TIVs 120. For example, the second redistribution structure 150 includes a second patterned conductive layer 152 and a second dielectric layer 154 stacked alternately. In some embodiments, one or more than one layers of dielectric materials are represented collectively as the second dielectric layer 154, and conductive features (e.g. conductive lines, conductive pads, and/or conductive vias) are collectively represented as the second patterned conductive layer 152. The materials of the second patterned conductive layer 152 and the second dielectric layer 154 may be similar to those of the first patterned conductive layer 112 and the first dielectric layer 114, so the details are not repeated for brevity.

In some embodiments, the second redistribution structure 150 is formed by first forming the bottommost one 154b of the second dielectric layer 154 on the first insulating layer 140, the TIVs 120, and the semiconductor die 130. The second dielectric layer 154 may be formed in a manner similar to that of the first dielectric layer 114. For example, the dielectric material is formed on the top surfaces 120a of the TIVs 120, the top surface 140a of the first insulating layer 140, and the top surfaces 134a of the die connectors 134. Next, a portion of the dielectric material is removed to form the bottommost one 154b of the second dielectric layer 154 with openings, where at least a portion of the top surfaces 120a of the TIVs 120 and at least a portion of the top surfaces 134a of the die connectors 134 may be accessibly revealed by the openings.

The bottommost one 152b of the second patterned conductive layer 152 is subsequently formed. The second patterned conductive layer 152 may be formed in a manner similar to that of the first patterned conductive layer 112. For example, via portions of the bottommost one 152b of the second patterned conductive layer 152 are formed in the openings of the bottommost one 154b of the second dielectric layer 154 to be in physical and electrical contact with the TIVs 120 and the die connectors 134, and other portions (e.g., lines, pads, etc.) of the bottommost one 152b of the second patterned conductive layer 152 are formed and extend on the bottommost one 154b of the second dielectric layer 154.

Additional second dielectric materials and additional second patterned conductive materials are be optionally formed on the bottommost one 154b of the second dielectric layer 154 to form additional electrical connections within the second redistribution structure 150. The additional second dielectric materials and additional second patterned conductive materials may be formed using similar processes as used to form the bottommost one 154b of the second dielectric layer 154 and the bottommost one 152b of the second patterned conductive layer 152. For example, the above-mentioned steps are performed multiple times to obtain a multi-layered redistribution structure as required by the circuit design. The numbers of the second dielectric layer 154 and the second patterned conductive layer 152 may be selected based on demand and are not limited in the disclosure. In some embodiments, the top surface of the topmost one 152t of the second patterned conductive layer 152 may be accessibly exposed by the topmost one 154t of the second dielectric layer 154 to be connected to a later-formed component. For example, bump pads (not labeled) are formed in the topmost one 152t of the second patterned conductive layer 152, and the topmost one 154t of the second dielectric layer 154 may be a solder mask (also referred to as solder resist) and includes openings 154p to accessibly reveal at least a portion of the topmost one 152t of the second patterned conductive layer 152 for further electrical connection.

In other embodiments, the second patterned conductive layer 152 is formed prior to the formation of the second dielectric layer 154. It should be noted that the forming sequence of the second dielectric layer 154 and the second patterned conductive layer 152 depends on the design requirement and construes no limitation in the disclosure. After forming the second redistribution structure 150, the semiconductor die 130 and the TIVs 120 are physically and electrically connected to the second redistribution structure 150, and the first redistribution structure 110 is electrically coupled to the second redistribution structure 150 through the TIVs 120. In some embodiments, the semiconductor die 130 is electrically coupled to the first redistribution structure 110 through the second redistribution structure 150 and the TIVs 120. In other embodiments, since the first redistribution structure 110 and the second redistribution structure 150 are formed layer by layer, the via portions of the first patterned conductive layer 112 and the second patterned conductive layer 152 are tapered along the same direction (e.g., the direction from the topmost one 152t to the bottommost one 152b).

Referring to FIG. 1E, at least one device package (e.g., 200A, 200B, and 200C) is disposed on the second redistribution structure 150. In some embodiments, a plurality of the device package (e.g., 200A, 200B, and 200C) is separately fabricated, and then mounted on the second redistribution structure 150. For example, the device package 200A includes an integrated circuit (IC) die 202 packaged in an encapsulating layer 204. The IC die 202 may be or may include a memory die, a processor die, a logic die, and/or a combination thereof, etc. It should be noted that a single IC die 202 is an illustrative example, and in some embodiments, multiple IC dies are packaged in the encapsulating layer 204 to perform various functions. The device package 200A also includes a redistribution layer (RDL) 206 and electrical connectors 208, where the RDL 206 may be formed on the IC die 202 and the encapsulating layer 204, and the electrical connectors 208 may be formed on the RDL 206 and bonded to the second redistribution structure 150. The device package 200A may be electrically coupled to the semiconductor die 130 through the electrical connectors 208 and the second redistribution structure 150.

In some embodiments, the layout density of the RDL 206 of the device package 200A is denser than that of the second redistribution structure 150 (and/or the first redistribution structure 110). The thickness and the line-spacing of the RDL 206 of the device package 200A may be thinner and finer than those of the second redistribution structure 150 (and/or the first redistribution structure 110). In some embodiments, the electrical connectors 208 are formed from conductive materials such as solder, copper, aluminum, gold, nickel, silver, the like, or a combination thereof. In some embodiments, the electrical connectors 208 are solder joints that are formed by forming solder material on the RDL 206 and then reflowing the solder material to enhance the adhesion between the device package 200A and the topmost one 152t of the second patterned conductive layer 152.

In some embodiments, the device package 200A is referred to as an integrated fan-out (InFO) package, and the RDL 206 is referred to as an InFO RDL. It is noted that the device package 200A shown in FIG. 1E is an illustrative example, and other three-dimensional integrated circuit (3DIC) package(s) may be used. For example, the device package 200A includes a chip-on-wafer (CoW) package, a flip-chip package, a package-on-package (PoP) structure, etc. In some embodiments, a plurality of device packages (e.g., 200A, 200B, and 200C) is disposed on the second redistribution structure 150. The device packages may be the same type of device package (e.g., 200A shown in FIG. 1E) or may be different types of device packages as listed above. In some embodiments, the device packages include an integrated passive device (IPD), a passive component (e.g., a capacitor, an inductor, a resistor, etc.), a surface mount device (SMD), or the like.

It is appreciated that the device packages (200B and 200C) in FIG. 1E are illustrated in a simplified manner, and various features and layers may be omitted. It is also appreciated that the number of device packages shown in FIG. 1E is an illustrative example, and a single device package or more than one device packages may be disposed on the second redistribution structure 150. The number of the device packages and the mounting method of the device packages are not limited in the disclosure. It is noted that the device package 200A in the following figures is illustrated in a simplified manner to indicate that the type of the device package 200A construe no limitation in the disclosure.

Referring to FIG. 1F, after disposing the device package (e.g., 200A, 200B, and/or 200C) on the second redistribution structure 150, a second insulating layer 210 is optionally formed on the second redistribution structure 150 to cover the device package (e.g., 200A, 200B, and/or 200C). For example, the material of the second insulating layer 210 includes molding compound, molding underfill, epoxy resin, or the like. In some embodiments, the second insulating layer 210 is a molding layer, an underfill layer, or a molding underfill layer. A planarizing process may be performed after the molding, or the planarizing process may be skipped. In some embodiments, the second insulating layer 210 extends along the sidewalls of each device package (200A, 200B, and 200C) and fills the gap between each device package (200A, 200B, and 200C) and the second redistribution structure 150. For example, the second insulating layer 210 laterally covers the electrical connectors 208 of the respective device package for protection.

In some embodiments, the material of the second insulating layer 210 is different from that of the first insulating layer 140. The hardness of the first insulating layer 140 may be greater than that of the second insulating layer 210. For example, the second insulating layer 210 is made of a material with a Young's modulus less than a Young's modulus of the first insulating layer 140. For example, the first insulating layer 140 has the Young's modulus in a range from about 5 GPa to about 15 GPa, and the second insulating layer 210 has the Young's modulus in a range from about 10 GPa to about 20 GPa. In some embodiments, the first insulating layer 140 and the second insulating layer 210 respectively includes fillers 142 and 212, which are pre-mixed into insulating base material before they are applied. For example, the fillers 142 and 212 include the particles of SiO₂, Al₂O₃, and/or the like. In some embodiments, particle sizes (e.g., diameters) of the fillers 212 of the second insulating layer 210 are less than the particle sizes of the fillers 142 of the first insulating layer 140.

Continue to FIG. 1F, in some embodiments, before forming the second insulating layer 210, a ring 220 is disposed on the topmost one 154$t$ of the second dielectric layer 154. In some embodiments, the ring 220 is attached to the topmost one 154$t$ of the second dielectric layer 154 via an adhesive material (not shown). For example, the ring 220 is formed of a rigid material, such as metal, steel, glass, ceramic, or the like. In some embodiments, the ring 220 is used to provide structural support and/or improve the planarity (e.g., flatness) of the underlying structure. In some embodiments in which the ring 220 is made of conductive material, the ring 220 is free of active/passive devices or electrical circuits, and may be electrically floating in the resulting structure. In other embodiments, the ring 220 functions as a heat dissipation component.

Still referring to FIG. 1F and also referring to FIG. 2, for example, FIG. 1F is a cross-sectional view along cross-section A-A of FIG. 2. In some embodiments, the ring 220 is a rectangular ring that has a hallow rectangle shape in the top view. The ring 220 may be disposed on the periphery of the second redistribution structure 150, and may encircle the device packages (200A, 200B, and 200C) therein. The ring 220 may be continuous or discontinuous. The ring 220 may take various forms and shapes (e.g., circle, oval, triangle, square, polygon, etc.). In some embodiments, after disposing the ring 220 on the second redistribution structure 150, the second insulating layer 210 is formed to cover the ring 220 and the device packages (200A, 200B, and 200C) that are surrounded by the ring 220. The second insulating layer 210 may extend along the sidewalls of the ring 220, and the top surface of the ring 220 may be also covered by the second insulating layer 210. It is noted that the numbers of the device packages and the shape of the ring shown in FIG. 2 are illustrative examples and construe no limitation in the disclosure. It is also noted that the ring 220 and the device packages (200A, 200B, and 200C) are shown in phantom in FIG. 2 to indicate that they may be buried in the second insulating layer 210. Alternatively, the ring is inlaid in the second insulating layer 210, and the top surface of the ring 220 may be exposed by the second insulating layer 210.

Referring to FIG. 1G, the temporary carrier TC is de-bonded from the first redistribution structure 110, and then a plurality of conductive terminals 300 are formed on the first redistribution structure 110. For example, a de-bonding process may remove the temporary carrier TC using any suitable technique, such as etching, grinding, mechanical peel off, shining a light beam over the surface of the temporary carrier TV to release the LTHC film, etc. After removing the temporary carrier TC, the first surface 110$a$ of the first redistribution structure 110 is exposed. Next, the conductive terminals 300 are formed on the first surface 110$a$ of the first redistribution structure 110 to be in physical and electrical contact with the bottommost one 112$b$ of the first patterned conductive layer 112. In some embodiments, the conductive terminals 300 are formed on the UBM pattern of the bottommost one 112$b$ of the first patterned conductive layer 112. In other embodiments, the UBM pattern is formed on the first surface 110$a$ of the first redistribution structure 110 after removing the temporary carrier TC, and then the conductive terminals 300 are formed on the UBM pattern.

The conductive terminals 300 may be or may include ball-grid-array (BGA) terminals, solder balls, controlled collapse chip connection (C4) bumps, electroless nickel-electroless palladium-immersion gold (ENEPIG) bumps, micro bumps, metal pillars, combination thereof (e.g., a metal pillar having a solder ball attached thereof), or the like. The conductive terminals 300 may be formed using any suitable formation method such as ball placement, plating, printing, solder transfer, or the like. In some embodiments in which the conductive terminals 300 include solder material, a reflow process is optionally performed to shape the solder material into the desired shapes.

In some embodiments, the aforementioned steps are performed in wafer form, and the resulting structure is cut by a singulation process, thereby separating the resulting structure into a plurality of electronic devices 10. The singulation process may be performed before or after forming the conductive terminals 300 that may depend on process requirements. For example, the singulation process is performed along scribe lines (e.g., between adjacent device regions of the plurality of electronic devices 10) to cut through the first redistribution structure 110, the first insulating layer 140, the second redistribution structure 150, and the second insulating layer 210. The singulation process may include a sawing process, a laser cut process, an etching process, combinations thereof, or the like. After singulation, the respective electronic device 10 has edges formed by coterminous sidewalls of the first redistribution structure 110, the first insulating layer 140, the second redistribution structure 150, and the second insulating layer 210. For example, the first redistribution structure 110, the first insulating layer 140, the second redistribution structure 150, and the second insulating layer 210 have a same width, and the sidewalls of these may be substantially leveled with one another. In some embodiments, the electronic device 10 is mounted on a substrate board (not shown; e.g., substrate board 25 in FIG. 3), where the conductive terminals 300 may be physically and electrically connected to the substrate board to transfer the electrical signal to/from the electronic device 10.

As shown in FIG. 1G, the electronic device 10 includes a first package component T1 and a second package component T2 stacked upon one another. The first package component T1 of the electronic device 10 may include the first insulating layer 140, the semiconductor die 130 embedded in the first insulating layer 140, the first redistribution structure 110 and the second redistribution structure 150 disposed on opposing sides of the first insulating layer 140, the TIVs 120 penetrating through the first insulating layer 140 to be in physical and electrical contact with the first and second redistribution structures 110 and 150, and the conductive terminals 300 disposed on the first redistribution structure 110 opposing to the first insulating layer 140. In some embodiments, the thickness of the first package component T1 is greater than that of the second package component T2 so that the first package component T1 provide mechanical support in the electronic device 10. For example, the first insulating layer 140 is a molding layer that is rigid enough to provide mechanical support in the first package component T1 and also provide stiffness to the electronic device 10.

The second package component T2 of the electronic device 10 connected to the first package component T1 may include at least one device package (e.g., 200A, 200B, and/or 200C). The ring 220 and the second insulating layer 210 are optionally formed at the second package component T2. In some embodiments, the die connectors 134 of the semiconductor die 130 at the first package component T1 face the second package component T2. For example, the electrical connectors 208 of the device package (e.g., 200A, 200B, and/or 200C) at the second package component T2 and the die connectors 134 of the semiconductor die 130 at the first package component T1 may face toward one another, and the second redistribution structure 150 may be interposed between the device package (e.g., 200A, 200B, and/or 200C) and the semiconductor die 130 to electrically couple the electrical connectors 208 of the device package (e.g., 200A, 200B, and/or 200C) to the die connectors 134 of the semiconductor die 130.

In some embodiments, the semiconductor die 130 is a bridge die to provide a shorter electrical connection path between the device packages (200A, 200B, and 200C). In some embodiments, the semiconductor die 130 translates commands between the device packages (200A, 200B, and 200C). In some embodiments, the semiconductor die 130 includes active and/or passive circuit to provide enhanced functionalities at the first package component T1. For example, the semiconductor die 130 includes decoupling capacitors for filtering the noise on power supply lines. In some embodiments, the IC die 202 of the device package 200A at the second package component T2 may include millions of components such as active devices and passive devices. The semiconductor die 130 at the first package component T1 may include some active devices and/or passive devices, thereby facilitating releasing layout region for those active devices and/or passive devices in the second package component T2.

The process of forming the first package component T1 and the second package component T2 may be performed in wafer level. In some embodiments, the typical package substrate including fiberglass resin core (e.g., FR4, BT resin, other PCB materials or films, a combination, etc.) is replaced with the first package component T1, thereby lowering manufacturing cost. In other embodiments, both of the typical package substrate and the silicon interposer may be replaced with the first package component T1. The use of the redistribution structure (e.g., 110 and 150) at the first package component T1 may allow for smaller features to be formed within the electronic device 10, thereby improving the integration of the device packages (200A, 200B, and 200C) mounted thereon.

In other embodiments, the second package component T2 is formed prior to the formation of the first package component T1. For example, the device packages (200A, 200B, and 200C) are encapsulated by the second insulating layer 210, and then the second redistribution structure 150 is formed on the device packages (200A, 200B, and 200C) and the second insulating layer 210. Next, the TIVs 120 are formed on the second redistribution structure 150 and the semiconductor die 130 is disposed on the second redistribution structure 150, and then the first insulating layer 140 is formed on the second redistribution structure 150 to cover the semiconductor die 130 and the TIVs 120. Subsequently, the first redistribution structure 110 is formed on the TIVs

120, the semiconductor die 130, and the first insulating layer 140, and then the conductive terminals 300 are formed on the first redistribution structure 110. In such embodiments, the via portions of the first patterned conductive layer and the second patterned conductive layer are tapered along the same direction from the first package component T1 to the second package component T2.

Figure 3:
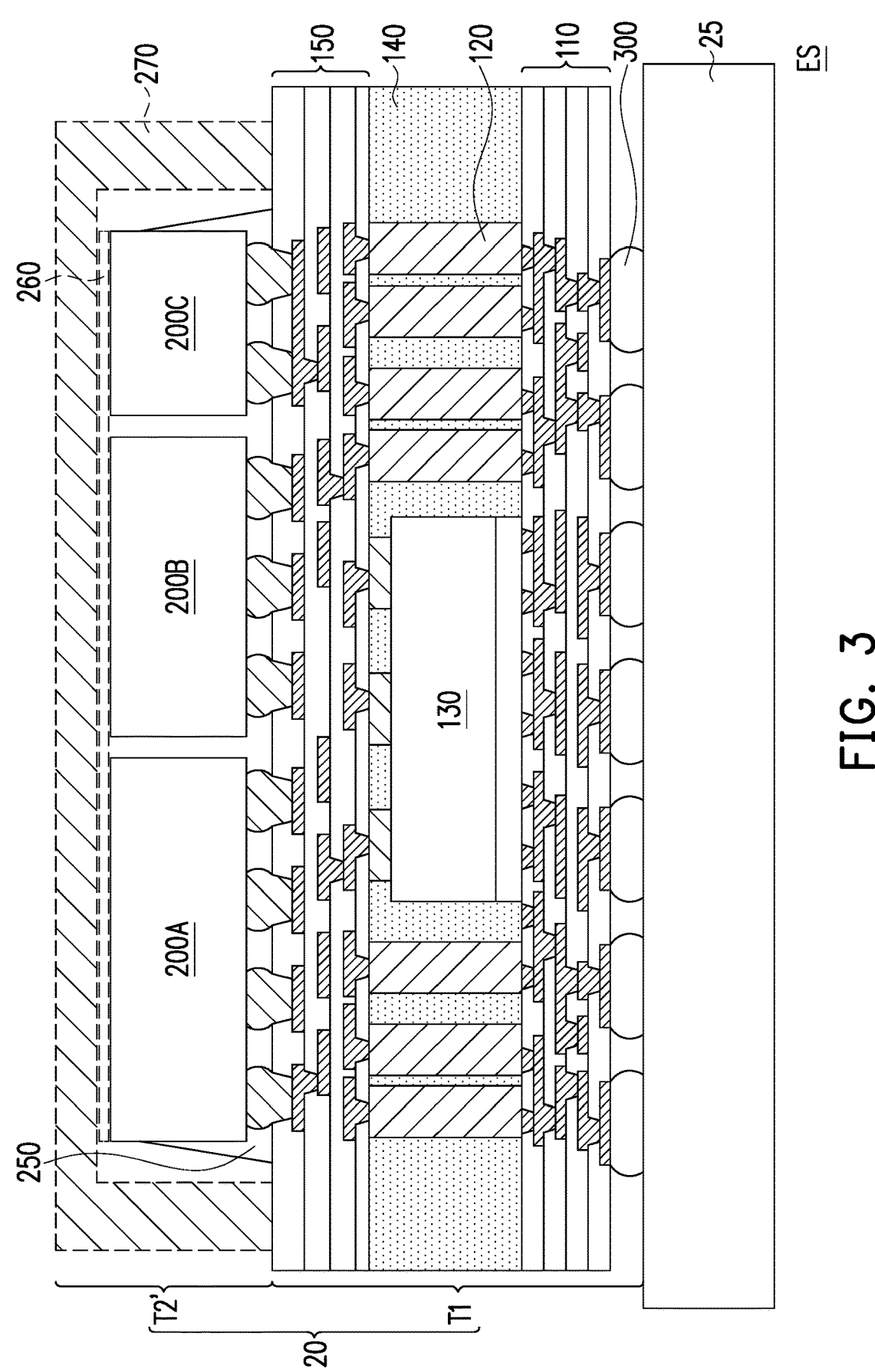
FIG. 3 is schematic cross-sectional view illustrating an application of electronic device in accordance with some embodiments of the disclosure.

FIG. 3 is schematic cross-sectional view illustrating an application of electronic device in accordance with some embodiments of the disclosure. Throughout the various figures and discussion, like reference numbers refer to like components. Referring to FIG. 3, an electronic device 20 is mounted on a substrate board 25 to form an electronic assembly ES. The substrate board 25 may be or may include a printed circuit board (PCB), a printed wiring board, a system board, a motherboard, and/or other circuit carrier that is capable of carrying the electronic device 20. For example, the electronic device 20 is in physical and electrical contact with the substrate board 25 through the conductive terminals 300 at the first package component T1 of the electrical device 20. The electronic device 20 is similar to the electronic device 10 described in FIG. 1G, and the difference therebetween lies in the second package component T2'.

In some embodiments, the second package component T2' is a multi-chip module including at least one device package (e.g., 200A, 200B, 200C) mounted on the second redistribution structure 150. An underfill layer 250 is subsequently formed on the second redistribution structure 150 to at least partially cover the device packages (200A, 200B, and 200C). For example, the underfill layer 250 fills the gap between the second redistribution structure 150 and the device packages (200A, 200B, and 200C) to surround the electrical connectors 208 of the device packages (200A, 200B, and 200C) for protection. In some embodiments, the underfill layer 250 fills the open spaces between the adjacent device packages (200A, 200B, and 200C). For example, the underfill layer 250 is formed in the gap and climbs up to cover at least a portion of the sidewalls of the device packages (200A, 200B, and 200C).

In some embodiments, a thermal interface material (TIM) layer 260 is formed on the back surfaces of the device packages (200A, 200B, and 200C). In some embodiments, the TIM layer 260 is formed by a dispensing process, a deposition process, a film attach process, and/or other suitable process. In some embodiments, a heat dissipation element 270 is placed over the second redistribution structure 150 to shield the device packages (200A, 200B, and 200C). The heat dissipation element 270 may be formed from a material with high thermal conductivity, such as copper, steel, gold, nickel, the like, and/or combinations thereof. In some embodiments, the heat dissipation element 270 is heat dissipation device (e.g., heat sink, heat spreader, or the like) and may be placed over the first package component T1 via a pick-and-place process. For example, the heat dissipation element 270 is attached to the second redistribution structure 150 of the first package component T1 via an adhesive (not shown). In some embodiments, the TIM layer 260 may physically and thermally couple the device packages (200A, 200B, and 200C) to the heat dissipation element 270 for providing a thermal interface between the device packages (200A, 200B, and 200C) and the heat dissipation element 270. In other embodiments, the TIM layer 260 and/or the heat dissipation element 270 may be omitted. It is noted that the TIM layer 260 and the heat dissipation element 270 are optionally included in the second package component T2, so that the TIM layer 260 and the heat dissipation element 270 are shown in phantom to indicate that they may be or may not be present.

Figure 4A:
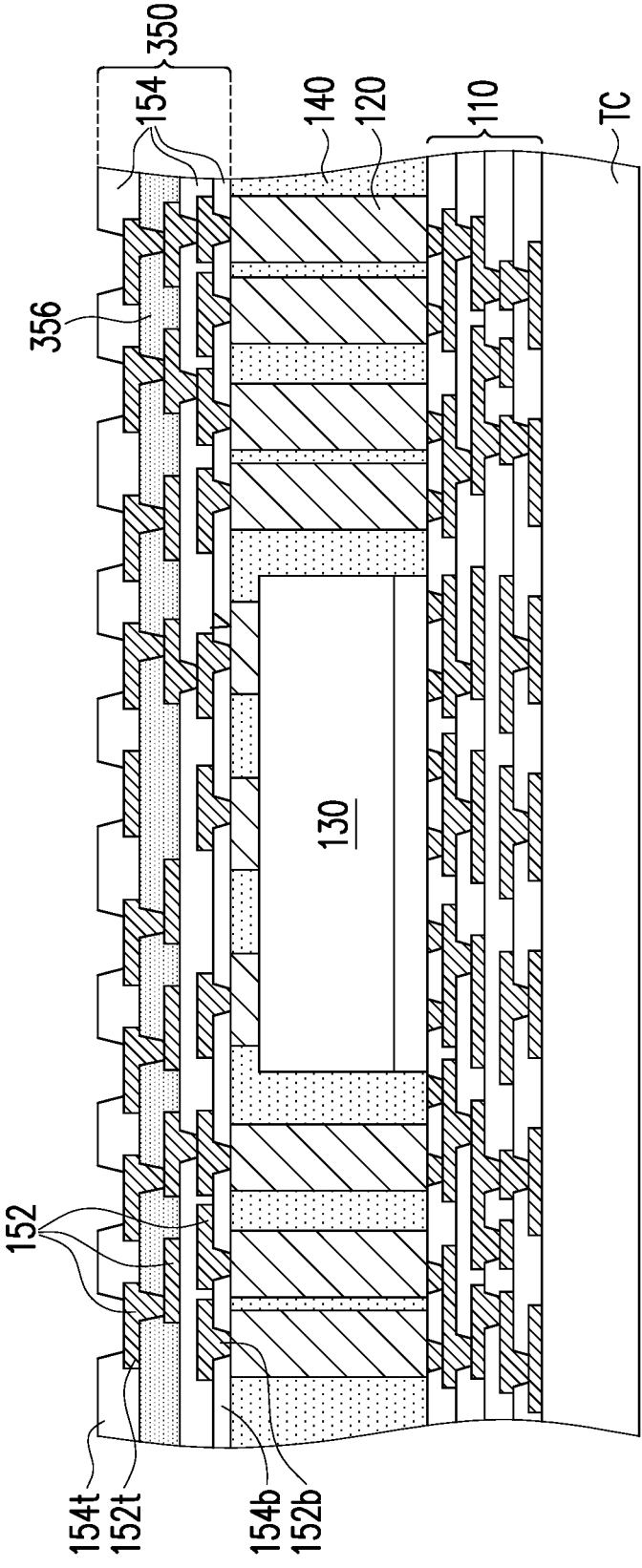
FIG. 4A and FIG. 4B are schematic cross-sectional views of various stages of manufacturing an electronic device in accordance with some embodiments of the disclosure.
Figure 4B:
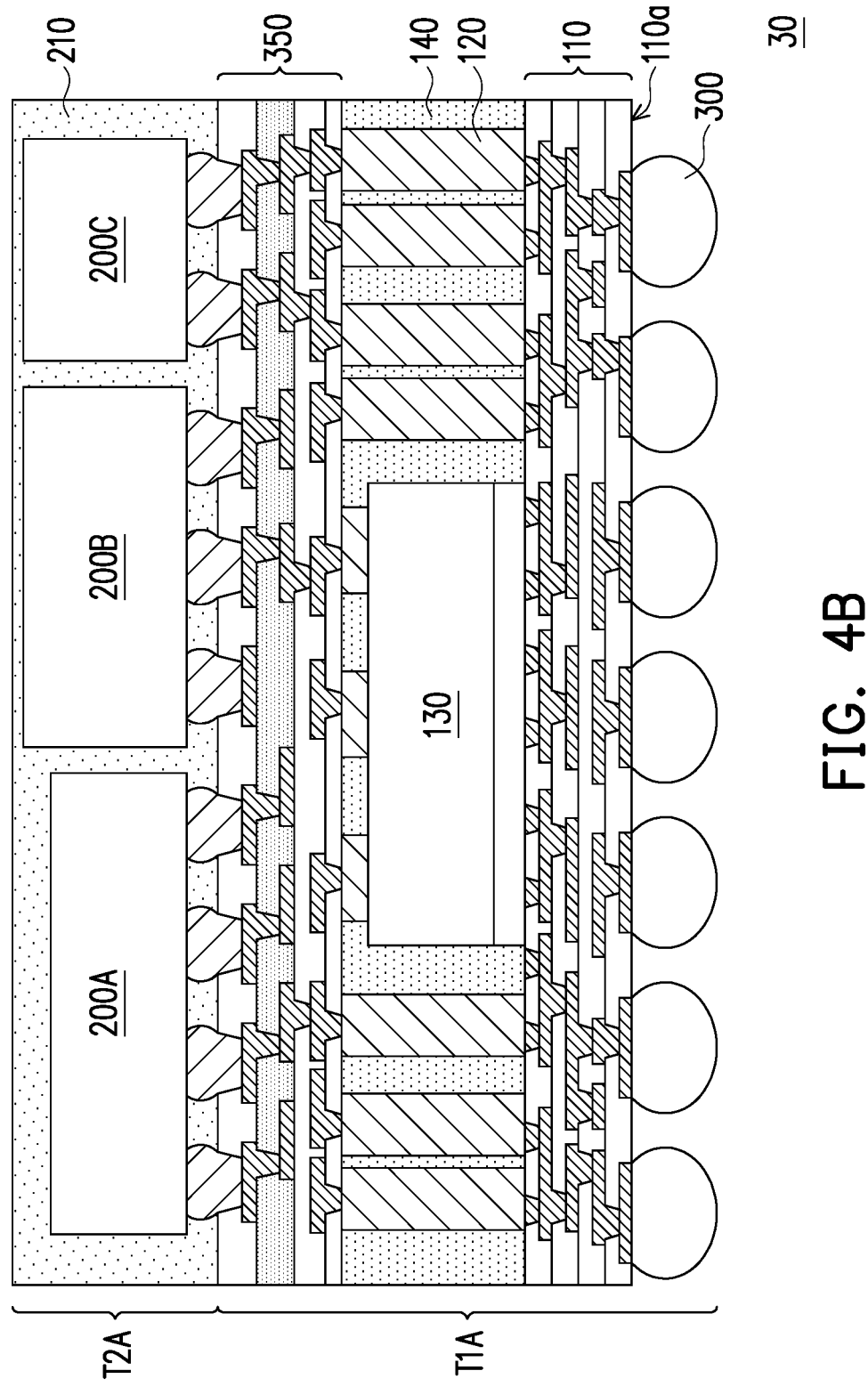

FIG. 4A and FIG. 4B are schematic cross-sectional views of various stages of manufacturing an electronic device in accordance with some embodiments of the disclosure. Throughout the various figures and discussion, like reference numbers refer to like components. Referring to FIG. 4A, the structure shown in FIG. 4A is similar to the structure shown in FIG. 1D, except that the second redistribution structure 350 shown in FIG. 4A further includes a third dielectric layer 356. For example, the third dielectric layer 356 of the second redistribution structure 350 is formed over the bottommost one 154b of the second dielectric layer 154. In some embodiments, a portion of the second patterned conductive layer 152 is covered by the third dielectric layer 356, and a portion of the second patterned conductive layer 152 penetrates through the third dielectric layer 356 to be in physical and electrical contact with the underlying portion of the second patterned conductive layer 152. A portion of the one of the second patterned conductive layer 152 may extend on the top surface of the third dielectric layer 356 to reroute the electrical signal of the TIVs 120 and the semiconductor dies 130. In some embodiments, the third dielectric layer 356 is interposed between the bottommost one 154b and the topmost one 154t of the second dielectric layer 154. In other embodiments, the third dielectric layer 356 serves the topmost layer of the second redistribution structure 350. It should be noted that the illustration of FIG. 4A is an example, and the configuration of the second redistribution structure 350 may vary depending on the product requirements.

For example, the hardness of the third dielectric layer 356 of the second redistribution structure 350 is greater than the hardness of the second dielectric layer 154. The third dielectric layer 356 may be made of a material with a Young's modulus higher than a Young's modulus of the second dielectric layer 154. In some embodiments, the third dielectric layer 356 of the second redistribution structure 350 is an insulating layer that includes molding compound, molding underfill, epoxy resin, etc. In some embodiments, the third dielectric layer 356 of the second redistribution structure 350 is of the same material to the first insulating layer 140 (or the second insulating layer 210 shown in FIG. 1G). For example, application of heat causes warpage during the formation of the first insulating layer 140, and as a result of the warpage, the conductive pattern of the second redistribution structure 350 may be distorted and different than a predetermined pattern, which affects subsequent processing and/or product reliability. The warpage problem may be solved by forming the third dielectric layer 356 within the second redistribution structure 350, with the layer having an inherent stress, which causes the resulting structure to warp against the existing warpage direction, hence compensating for the existing warpage. For example, the warpage characteristics of the underlying structure are analyzed prior to forming the third dielectric layer 356. By analyzing warpage, the material property (e.g., hardness thickness, etc.) of the third dielectric layer 356 may be determined, thereby facilitating warpage management.

Referring to FIG. 4B, after forming the second redistribution structure 350, at least one device package (e.g., 200A, 200B, and/or 200C) is mounted on the second redistribution structure 350. The second insulating layer 210 is optionally formed on the second redistribution structure 350 to cover the device packages (200A, 200B, 200C) for protection. In some embodiments, the second insulating layer 210 is replaced with an underfill layer (e.g., the underfill layer 250 shown in FIG. 3) to enhance the adhesion between the device packages (200A, 200B, and/or 200C) and the second redistribution structure 350.

The temporary carrier TC (shown in FIG. 4A) may be subsequently de-bonded to expose the first surface 110a of the first redistribution structure 110. Next, the conductive terminals 300 are formed on the first surface 110a of the first redistribution structure 110 for further electrical connection. In some embodiments, the aforementioned processes are performed in wafer level, and a singulation process may be performed to cut through the first redistribution structure 110, the first insulating layer 140, the second redistribution structure 350, and the second insulating layer 210 (if present). In some embodiments, the singulation is performed after forming the conductive terminals 300. Alternatively, the singulation is performed prior to the formation of the conductive terminals 300 and after removal of the temporary carrier TC. In some embodiments, after the singulation, the individual electronic device 30 is formed.

As shown in FIG. 4B, the electronic device 30 includes a first package component T1A and a second package component T2A stacked on the first package component T1A. Due to the singulation process, the edges of the first package component T1A may be substantially flush with the edges of the second package component T2A. For example, the sidewalls of the first redistribution structure 110, the first insulating layer 140, the second redistribution structure 350, and the second insulating layer 210 (if present) may be substantially leveled with one another. In some embodiments, the electronic device 30 is further mounted on a substrate board (not shown; e.g., substrate board 25 in FIG. 3), where the conductive terminals 300 may be physically and electrically connected to the substrate board to transfer the electrical signal to/from the electronic device 30.

Figure 5A:
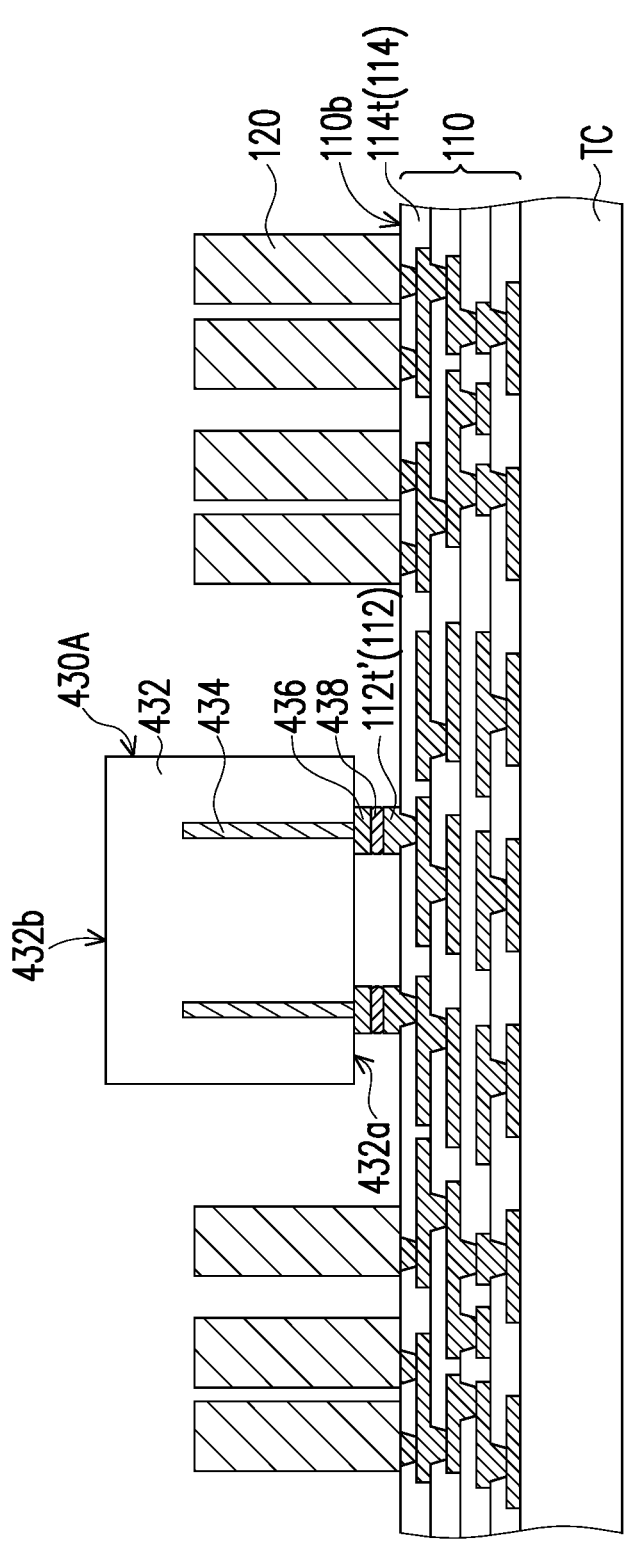
FIG. 5A to FIG. 5D are schematic cross-sectional views of various stages of manufacturing an electronic device in accordance with some embodiments of the disclosure.

FIG. 5A to FIG. 5D are schematic cross-sectional views of various stages of manufacturing an electronic device in accordance with some embodiments of the disclosure. Throughout the various figures and discussion, like reference numbers refer to like components. Referring to FIG. 5A, the TIVs 120 and a semiconductor die 430A are located on the first redistribution structure 110. The formations of the first redistribution structure 110 and the TIVs 120 are similar to the processes described in FIG. 1A, so the detailed descriptions are not repeated for the sake of brevity. In some embodiments, the topmost one 112t' of the first patterned conductive layer 112 includes pad portions formed on the top surface of the topmost one 114t of the first dielectric layer 114 for further electrical connection.

The semiconductor die 430A includes a semiconductor substrate 432 with a first side 432a and a second side 432b opposite to the first side 432a. The semiconductor substrate 432 may include bulk silicon, doped or undoped, or an active layer of silicon-on-insulator (SOI) substrate. Other semiconductor substrates that may be used include multi-layered substrates, gradient substrates, or hybrid orientation substrates. In some embodiments, through semiconductor vias (TSVs) 434 are formed in the semiconductor substrate 432 by depositing one or more diffusion barrier layer(s) or isolation layer(s), depositing a seed layer, and depositing a conductive material (e.g., tungsten, titanium, aluminum, copper, any combinations thereof and/or the like) into the openings of the semiconductor substrate 432 through plating or other suitable process. For example, the respective TSV 434 has one end that is buried in the semiconductor substrate 432 at this stage.

In some embodiments, conductive pads 436 are formed at the first side 432a of the semiconductor substrate 432 and electrically connected to the TSVs 434. The conductive pads 436 may be formed from a conductive material such as copper, aluminum, gold, nickel, palladium, the like, or combinations thereof. It should be noted that the semiconductor die 430A is illustrated in a simplified manner, some layers and features are not shown. For example, an interconnection structure (not shown) is optionally formed at the first side 432 of the semiconductor substrate 432 to be in contact with the TSVs 434 and the conductive pads 436, and some semiconductor devices (e.g., active components and/or passive components) may be formed in the semiconductor substrate 432 and electrically coupled to the interconnection structure. In some embodiments, the conductive pads 438 are the topmost layer of the interconnection structure for further electrical connection.

In some embodiments, conductive bumps 438 are formed on the conductive pads 436 opposite to the semiconductor substrate 432. The conductive bumps 438 may be formed from a conductive material such as solder, and may be formed by initially forming a layer of solder on the conductive pads 436 through methods such as evaporation, electroplating, printing, solder transfer, ball placement, or the like. In some embodiments, before disposing the semiconductor die 430A on the first redistribution structure 110, a layer of solder is formed on the conductive pads 436 of the semiconductor die 430A and another layer of solder is formed on the topmost one 112t' of the first patterned conductive layer 112, thereby facilitating alignment after reflowing.

In some embodiments, the semiconductor die 430A is attached to the first redistribution structure 110 with connections that include the conductive pads 436, the conductive bumps 438, and the pad portions of the topmost one 112t' of the first patterned conductive layer 112. In some embodiments in which the conductive bumps 438 are solder bumps, the connections include solder joints. For example, two opposing sides of the respective conductive bump 438 are respectively bonded to the conductive pads 436 and the pad portions of the topmost one 112t' of the first patterned conductive layer 112. In some embodiments, a reflow process is performed in order to enhance the adhesion between the semiconductor die 430A and the first redistribution structure 110. In other embodiments, the semiconductor die 430A is connected to the first redistribution structure 110 by face-to-face bonds without the use of solder.

Figure 5B:
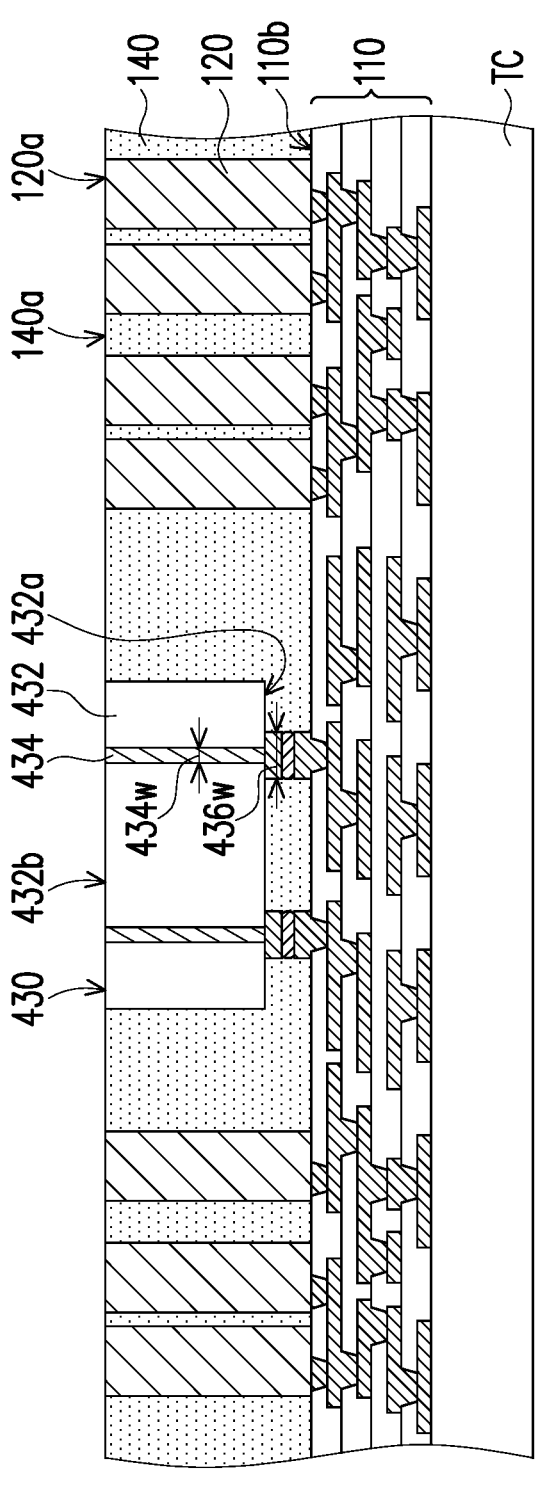

Referring to FIG. 5B, a first insulating layer 140 is formed on the first redistribution structure 110, and the semiconductor die 430A is thinned to accessibly reveal the TSVs 434 for further electrical connection. For example, the semiconductor die 430A and the TIVs 120 are over-molded by an insulating material (not shown). In some embodiments, the insulating material is a molding underfill layer. Alternatively, the insulating material may be or may include molding compound, epoxy resin, etc. Next, a planarizing process (e.g., grinding, chemical mechanical polishing (CMP), etching, combination of these, etc.) is performed on the insulating material. During the planarization, a portion of the semiconductor substrate 432 is removed until at least a portion of the respective TSV 434 is accessibly exposed at the second side 432b.

After revealing the TSVs 434, the thinned semiconductor die 430 is formed. For example, after the planarization, the top surfaces 120a of the TIVs 120, the top surface 140a of the first insulating layer 140, and the second side 432b of the thinned semiconductor die 430 become substantially leveled and flush with one another. The first insulating layer 140 may extend along the sidewalls of the thinned semiconductor die 430 and the TIVs 120. In some embodiments, the first insulating layer 140 is between the first side 432a of the semiconductor substrate 432 and the second surface 110b of the first redistribution structure 110 to laterally cover the connections (e.g., the conductive pads 436, the conductive bumps 438, and the pad portions of the topmost one 112t' of the first patterned conductive layer 112) of the thinned semiconductor die 430 and the first redistribution structure 110.

Figure 5C:
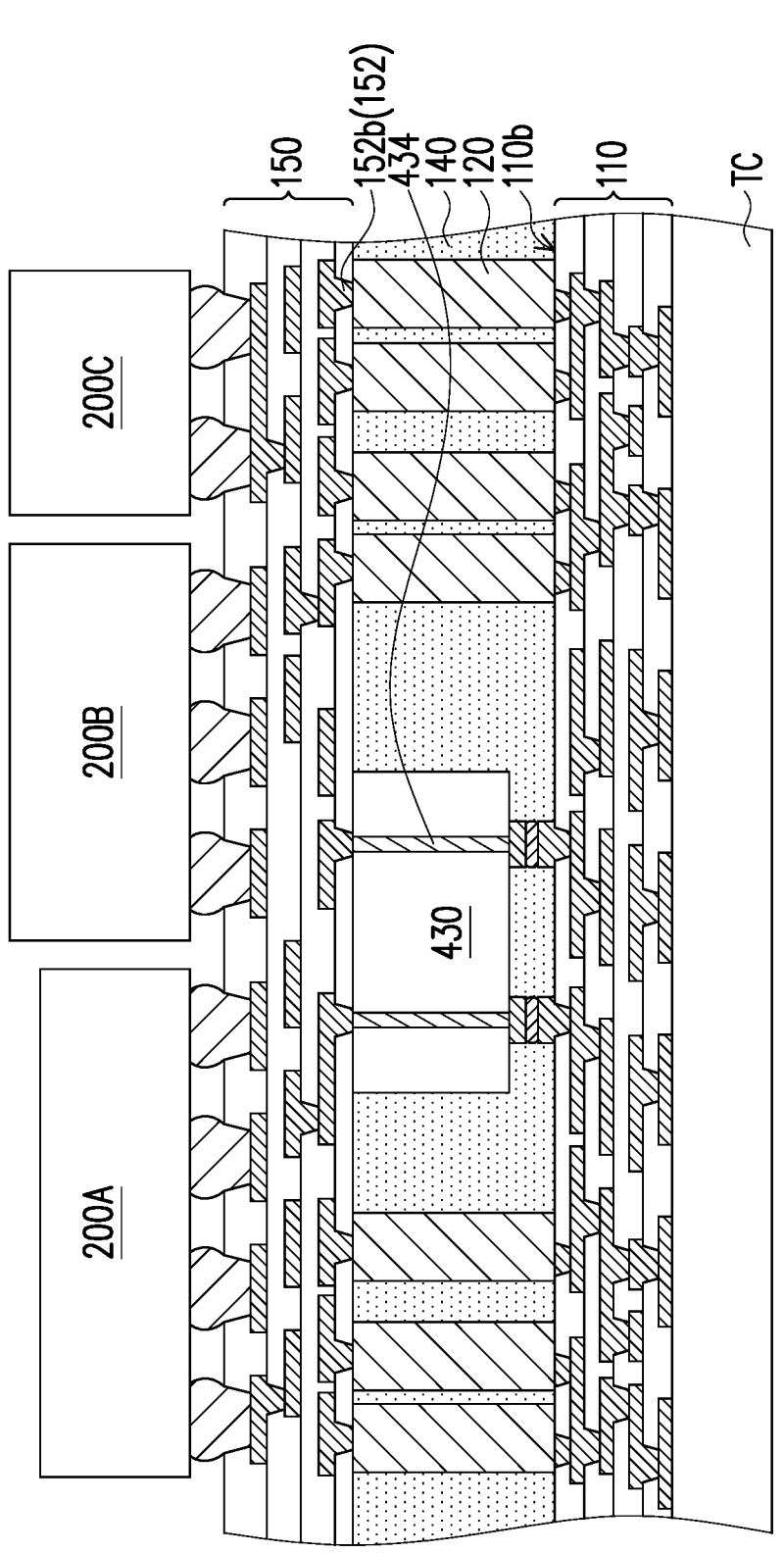

Referring to FIG. 5C, the second redistribution structure 150 is formed on the first insulating layer 140, the TIVs 120, and the thinned semiconductor die 430. The formation of the second redistribution structure 150 is similar to that of the second redistribution structure 150 described in FIG. 1D, so the detailed descriptions are not repeated for the sake of brevity. In some embodiments, the bottommost one 152b of the second patterned conductive layer 152 is formed to be in physical and electrical contact with the TIVs 120 and the TSVs 434 of the thinned semiconductor die 430. The second redistribution structure 150 may be electrically coupled to the first redistribution structure 110 through the TIVs 120 and/or the TSVs 434. In some embodiments, the semiconductor devices (if present) of the thinned semiconductor die 430 are electrically coupled to the first redistribution structure 110 and the second redistribution structure 150.

In some embodiments, after forming the second redistribution structure 150, at least one device package (e.g., 200A, 200B, and/or 200C) is disposed on the second redistribution structure 150. In some embodiments, a plurality of device packages (200A, 200B, and 200C) is mounted on the second redistribution structure 150. It is appreciated that the device packages (200A, 200B, and 200C) in FIG. 5C are illustrated in a simplified manner and may be similar as described above, so the detailed descriptions of device packages are omitted for the sake of brevity.

Figure 5D:
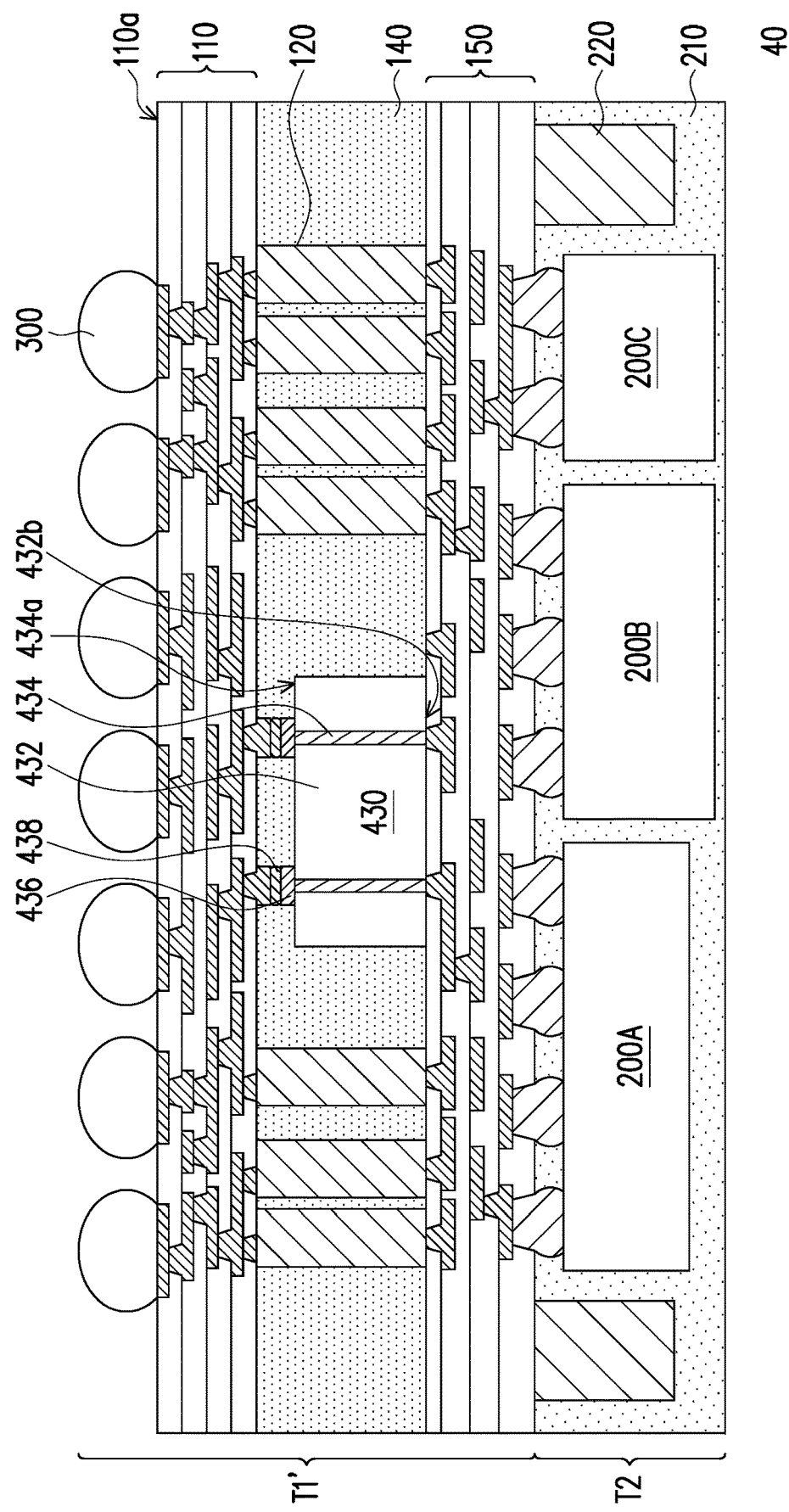

Referring to FIG. 5D, an electronic device 40 that includes a first package component T1' and the second package component T2 is provided. For example, the second package component T2 includes the second insulating layer 210 formed on the second redistribution structure 150 to cover the device packages (200A, 200B, and 200C). In some embodiments, the second package component T2 includes the ring 220 disposed on the second redistribution structure 150, and the ring 220 may be placed prior to the formation of the second insulating layer 210. For example, when forming the second insulating layer 210, the ring 220 and the device packages (200A, 200B, and 200C) encircled by the ring 220 are molded by the second insulating layer 210. The forming processes of the second package component T2 is similar to the processes described in FIG. 1F, so the detailed descriptions are omitted for the sake of brevity.

In some embodiments, the temporary carrier TC is removed to expose the first surface 110a of the first redistribution structure 110. Next, the conductive terminals 300 are formed on the first redistribution structure 110 to be electrically connected to the first redistribution structure 110. The removing process of the temporary carrier TC and the forming process of the conductive terminals 300 are similar to the processes described in FIG. 1G, so the detailed descriptions are omitted for the sake of brevity. In some embodiments, the electronic device 40 is mounted on a substrate board (not shown; e.g., substrate board 25 in FIG. 3), where the conductive terminals 300 may be physically and electrically connected to the substrate board to transfer the electrical signal to/from the electronic device 40.

As shown in FIG. 5D, the first package component T1' of the electronic device 40 includes the thinned semiconductor die 430 having the TSVs 434 which penetrate through the semiconductor substrate 432 to provide vertical connection between the first side 432a and the second side 432b. In some embodiments, the connections of the thinned semiconductor die 430 and the first redistribution structure 110 may include solder material (i.e. the conductive bumps 438). In other embodiments, the connections of the thinned semiconductor die 430 and the first redistribution structure 110 are free of solder material, and the conductive pads 436 and the first redistribution structure 110 are connected using direct metal-to-metal bonding, conductive paste, or other suitable techniques. In other embodiments, the second redistribution structure 150 is replaced with the second redistribution structure 350 described in FIGS. 4A-4B. In some other embodiments, the second package component T2 is formed prior to the formation of the first package component T1'. Other variations may be carried out while still remaining within the disclosure.

Figure 6A:
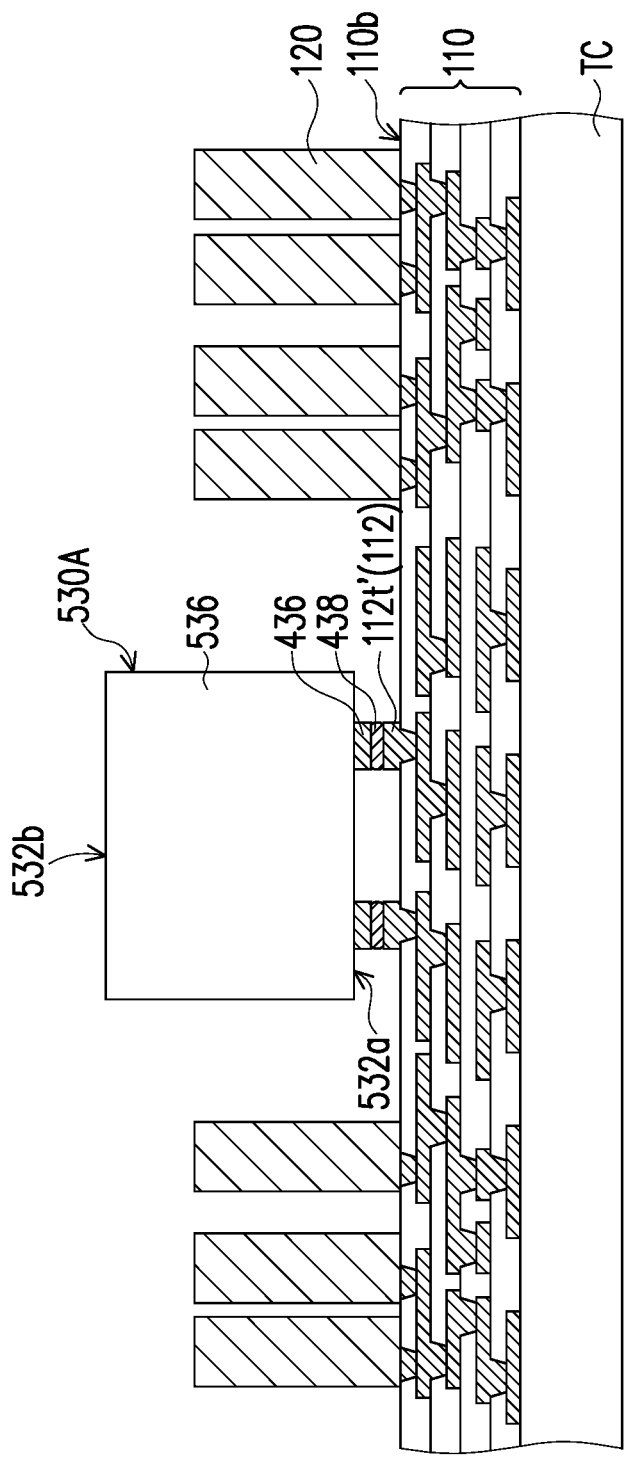
FIG. 6A to FIG. 6C are schematic cross-sectional views of partial stages of manufacturing an electronic device in accordance with some embodiments of the disclosure.
Figure 6B:
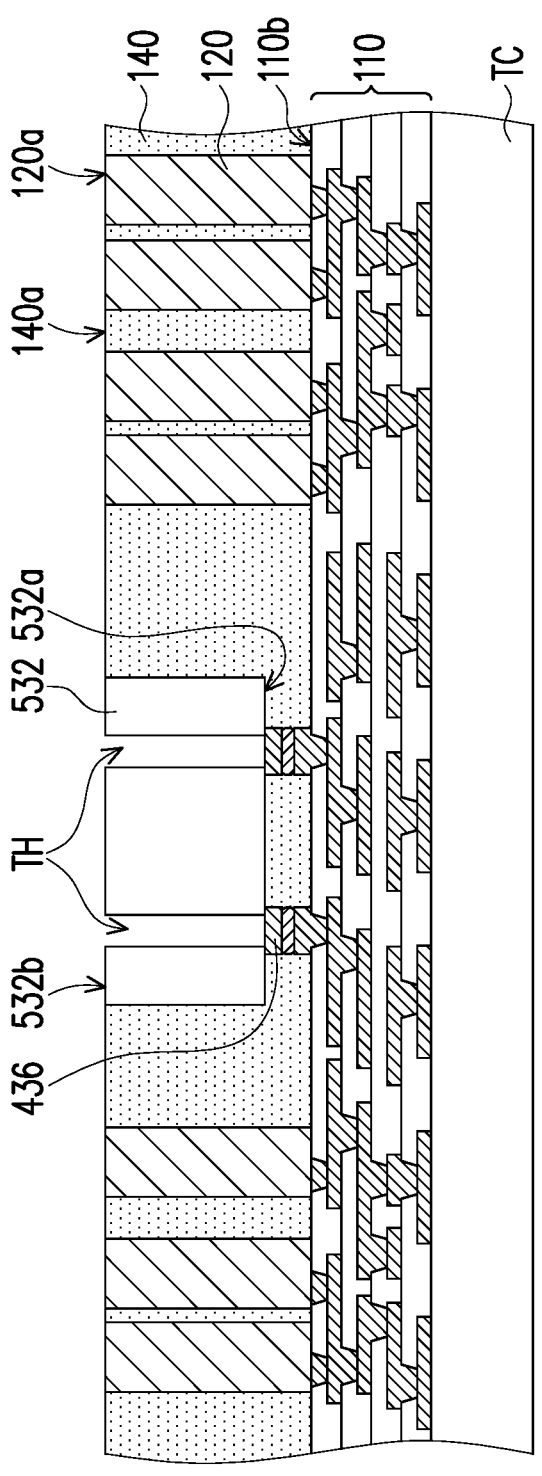
Figure 6C:
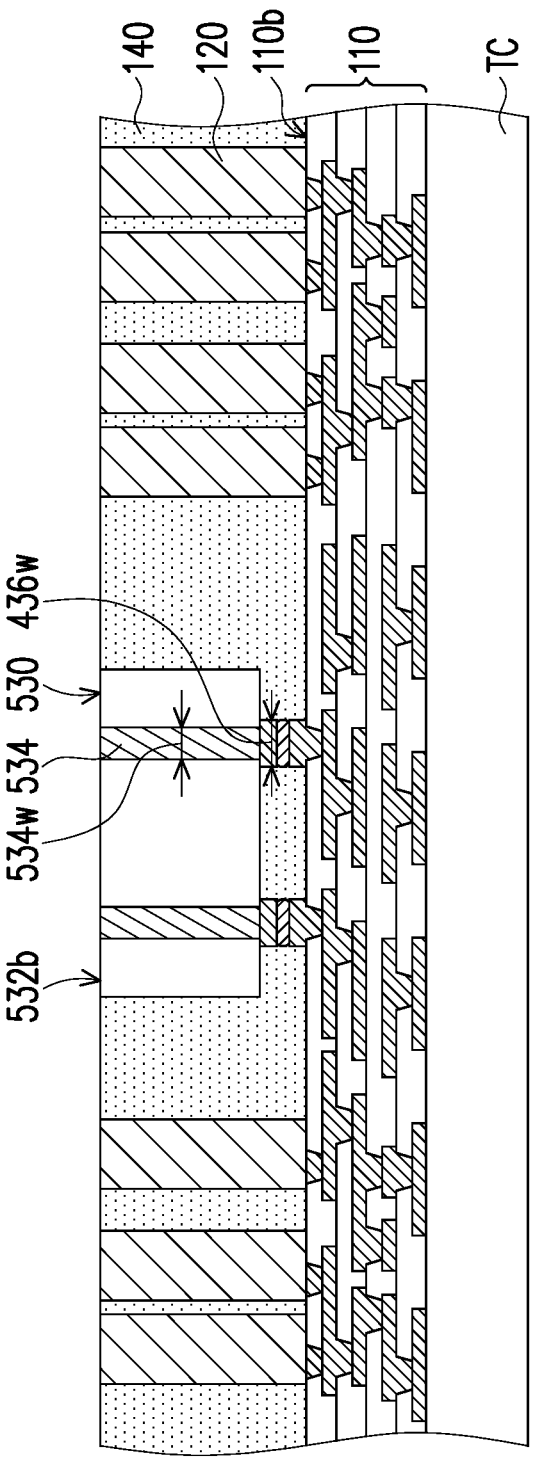

FIG. 6A to FIG. 6C are schematic cross-sectional views of partial stages of manufacturing an electronic device in accordance with some embodiments of the disclosure. Throughout the various figures and discussion, like reference numbers refer to like components. Referring to FIG. 6A and FIG. 6B, the TIVs 120 and a semiconductor die 530A are located on the first redistribution structure 110. The formations of the first redistribution structure 110 and the TIVs 120 are similar to the processes described in FIG. 1A, so the detailed descriptions are not repeated for the sake of brevity. The difference between the semiconductor die 530A and the semiconductor die 430A shown in FIG. 5A lies in that the TSVs 434 of the semiconductor die 430A are pre-formed, while the TSVs of the semiconductor die 530A are formed after disposing on the first redistribution structure 110.

For example, a semiconductor substrate 532 of the semiconductor die 530A that is free of the TSVs is attached to the first redistribution structure 110 through the connections that include the conductive pads 436, the conductive bumps 438, and the pad portions of the topmost one 112t' of the first patterned conductive layer 112. The connections may be similar to the connections described in FIG. 5A, so the detailed descriptions are not repeated for the sake of brevity.

Next, the first insulating layer 140 is formed on the first redistribution structure 110 to cover the semiconductor die 530A and the TIVs 120. The forming process of the first insulating layer 140 similar to the first insulating layer 140 described in FIG. 1C. For example, the semiconductor die 530A and the TIVs 120 are over-molded by the insulating material, and then the planarization process is performed on the insulating material to accessibly reveal the TIVs 120. In some embodiments, during the planarization, the semiconductor die 530A may be thinned as well. In some embodiments, after forming the first insulating layer 140, at least one through hole TH is formed in the semiconductor substrate 532 to accessibly reveal at least a portion of the conductive pads 436. In some embodiments, one or more than one etching steps are implemented to remove a portion of the semiconductor substrate 532 so as to form the through holes TH penetrating from the second side 532b to the first side 532a.

Referring to FIG. 6C, after forming the through holes TH, the TSVs 534 are formed in the through holes TH to be electrically connected to the corresponding conductive pads 436. For example, the method of forming the TSVs 534 includes at least the following steps. An isolation layer (not shown) is conformally formed on the semiconductor substrate 532 and covers sidewalls of the semiconductor substrate 532 that define the through holes TH. Next, a seed layer (not shown) may be conformally formed on the isolation layer. The seed layer may be or may include a copper layer, a titanium/copper bilayer, or other suitable metal layer that aids in the formation of a thicker conductive material during subsequent processing steps. Subsequently, a conductive material (e.g., copper, aluminum, silver, gold, metal alloy, etc.) is formed on the seed layer and inside the through holes TH. Afterwards, excess materials (e.g., isolation layer, seed layer, and conductive material) on the second side 532b of the semiconductor substrate 532 may be removed to form a planarized surface of the semiconductor die 530.

In some embodiments, since the TSVs 534 are formed after attaching to the first redistribution structure 110, the sizes (e.g., width or diameter) of through holes TH are large enough to facilitate alignment. For example, the respective TSV 534 includes a width (or diameter) 534w greater than the width 434w of the respective TSV 434 that is pre-formed as shown in FIG. 5B. For example, a ratio ($534w/436w$) of the width 534w of the respective TSV 534 to the width 436w of the corresponding conductive pad 436 is greater than ratio ($434w/436w$) of the width 434w of the respective TSV 434 shown in FIG. 5B to the width 436w of the corresponding conductive pad 436.

After forming the TSVs 534, the subsequent steps may be performed as described in FIG. 5C to FIG. 5D to form an electronic device. For example, the resulting electronic device fabricated by the method described in FIGS. 6A-6C and the electronic device 40 may be similar, and the difference therebetween may include the widths 534w of the TSVs 534.

Figure 7:
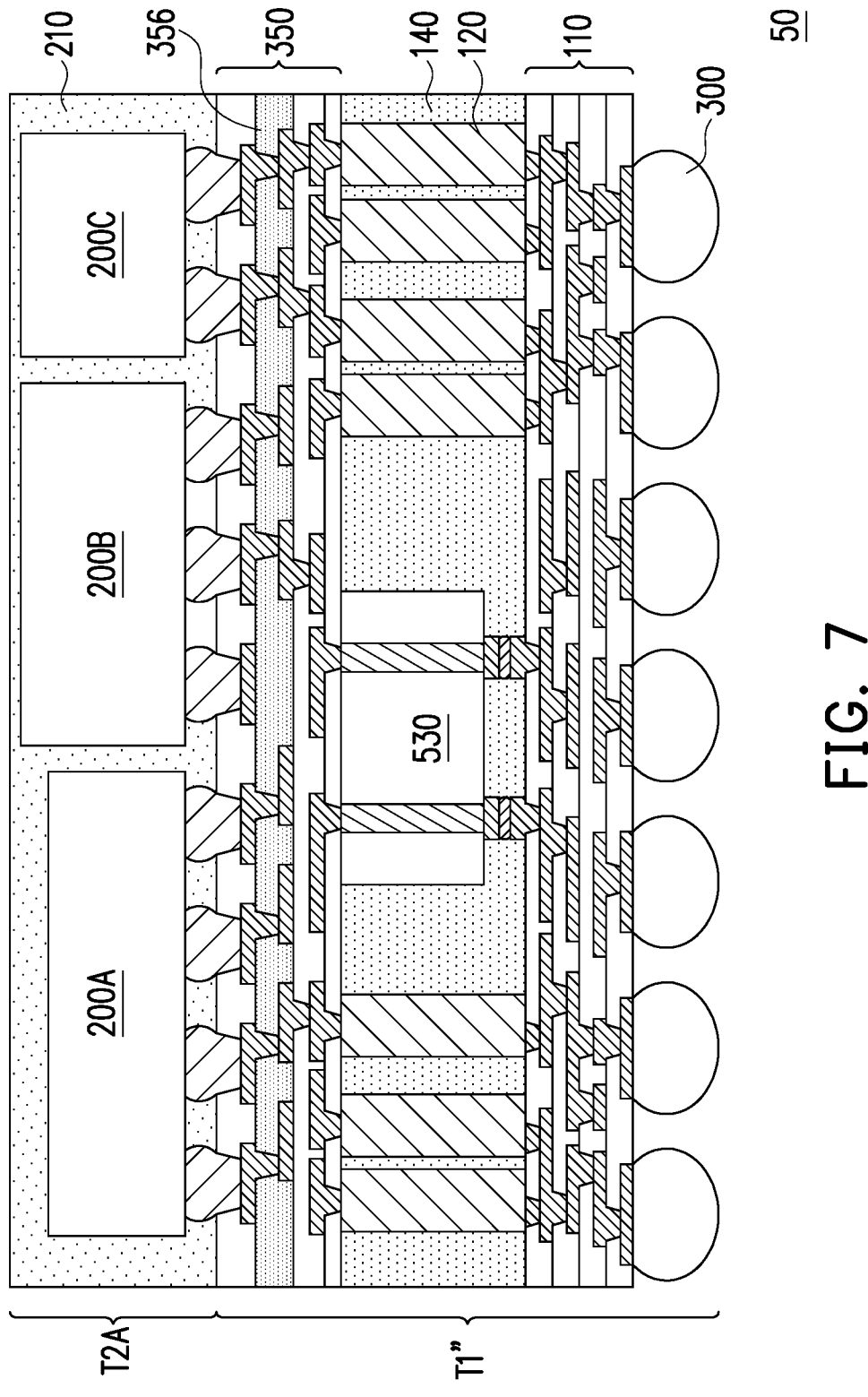
FIG. 7 is a schematic cross-sectional view of an electronic device in accordance with some embodiments of the disclosure.

FIG. 7 is a schematic cross-sectional view of an electronic device in accordance with some embodiments of the disclosure. Throughout the various figures and discussion, like reference numbers refer to like components. Referring to FIG. 7, an electronic device 50 including the first package component T1" and the second package component T2A stacked thereon is provided. The electronic device 50 may be similar to the electronic device 40 described in FIG. 5D or the electronic device 30 described in FIG. 4B, and like reference numbers refer to like components.

For example, the difference between the first package component T1" of the electronic device 50 and the first package component T1' of the electronic device 40 lies in that the second redistribution structure 350 in the first package component T1" of the electronic device 50 includes the third dielectric layer 356 for warpage management. The second redistribution structure 350 is similar to the second redistribution structure 350 described in FIGS. 4A-4B, so the detailed descriptions are not repeated for the sake of brevity. The second package component T2A is disposed on and electrically coupled to the first package component T1. For example, the second package component T2A is similar to the second package component T2A described in FIG. 4B, so the detailed descriptions are omitted for brevity. In other embodiments, the second insulating layer 210 of the second package component T2A covering the device packages is replaced with the underfill layer 250 described in FIG. 3.

In some embodiments, the first package component T1" is formed prior to the formation of the second package component T2A. Alternatively, the second package component T2A is formed prior to the formation of the first package component T1". In some embodiments, the electronic device 50 is mounted on a substrate board (not shown; e.g., substrate board 25 in FIG. 3), where the conductive terminals 300 may be physically and electrically connected to the substrate board to transfer the electrical signal to/from the electronic device 50. Other elements (e.g., TIM layer, heat dissipation element, ring, or the like) may be added in the second package component T2A. It is noted that the structure shown in FIG. 7 is an illustrative example, and that variations thereof may be carried out while still remaining within the disclosure.

Figure 8A:
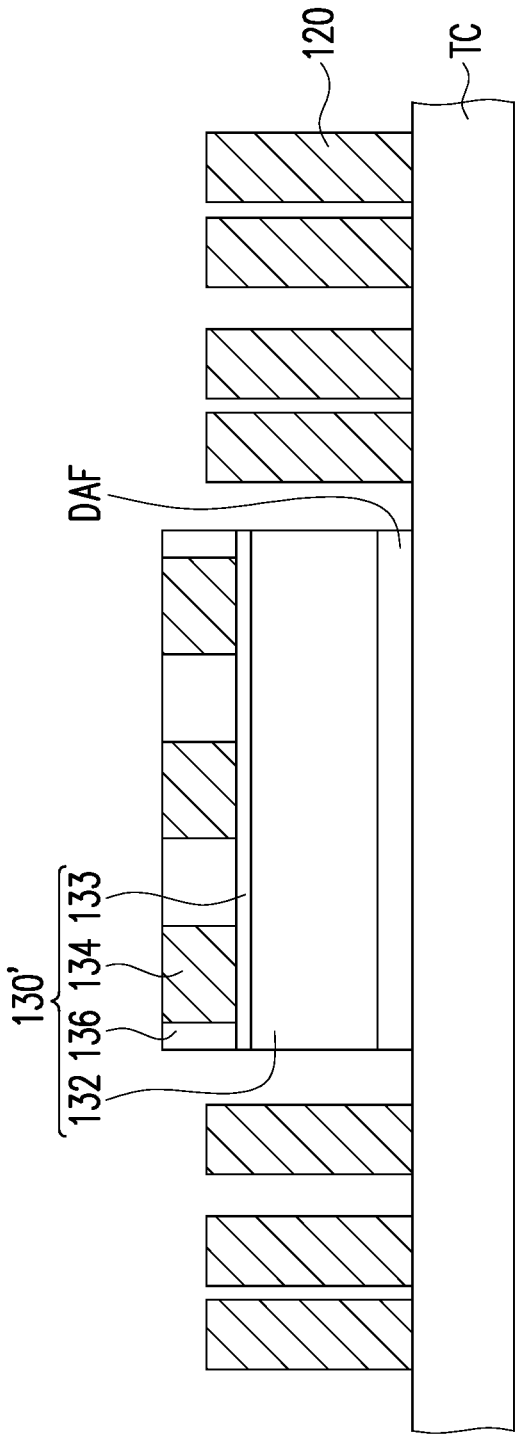
FIG. 8A to FIG. 8H are schematic cross-sectional views of various stages of manufacturing an electronic device in accordance with some embodiments of the disclosure.

FIG. 8A to FIG. 8H are schematic cross-sectional views of various stages of manufacturing an electronic device in accordance with some embodiments of the disclosure. Throughout the various figures and discussion, like reference numbers refer to like components. Referring to FIG. 8A, a semiconductor die 130' and the TIVs 120 are disposed on the temporary carrier TC. In some embodiments, the TIVs 120 are formed on the temporary carrier TC prior to disposing the semiconductor die 130' over the temporary carrier TC. For example, the semiconductor die 130' is attached to the temporary carrier TC through the die attach film DAF. In other embodiments, the semiconductor die 130' is disposed on the temporary carrier TC before forming the TIVs 120.

In some embodiments, the semiconductor die 130' is a bridge die (e.g., a silicon bridge). In some embodiments, the bridge die is free of active components and/or passive components. In some embodiments, the bridge die includes active components and/or passive components. For example, the semiconductor die 130' includes an interconnecting layer 133 formed on the semiconductor substrate 132. The die connectors 134 may be formed on and electrically connected to the interconnecting layer 133, and a protective layer 136 may be formed on the interconnecting layer 133 to cover the die connectors 134. In some embodiments, at the step of disposing the semiconductor die 130', the die connectors 134 are embedded in the protective layer 136 for protection. In other embodiments, the semiconductor die 130' includes active components and/or passive components for various functions.

Figure 8B:
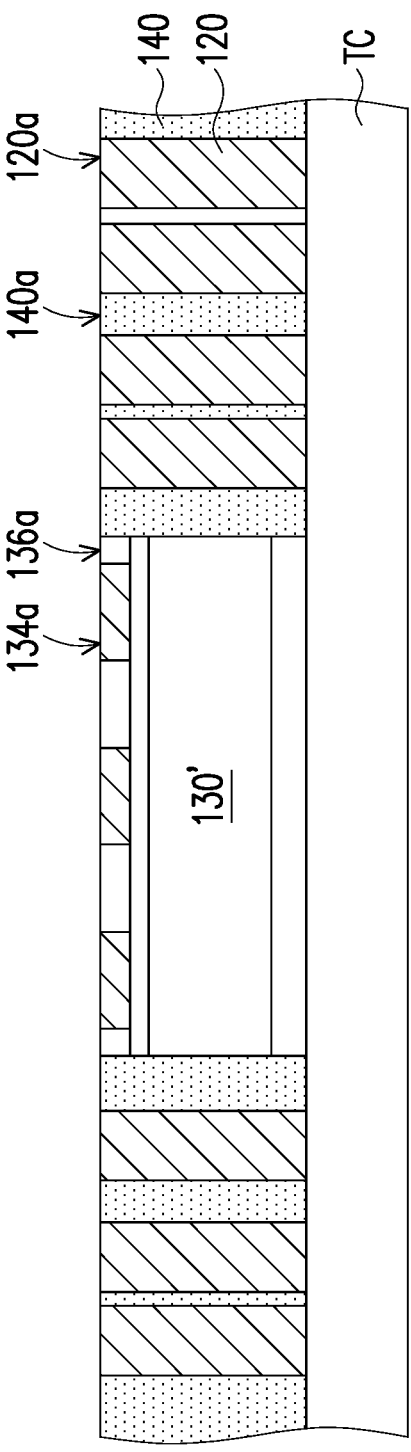

Referring to FIG. 8B, the first insulating layer 140 is formed on the temporary carrier TC to laterally cover the semiconductor die 130' and the TIVs 120. The step of forming the first insulating layer 140 may be similar to the step described in FIG. 1C, so the detailed descriptions are not repeated for the sake of brevity. In some embodiments, when the planarizing process is performed, a portion of the protective layer 136 is removed until at least a portion of the die connectors 134 is accessibly exposed for further electrical connection. In some embodiments, after the planarizing process, the protective layer 136 laterally covers the sidewalls of the respective die connector 134. The top surface 136a of the protective layer 136 may be substantially aligned with the top surfaces 134a of the die connectors 134. In some embodiments, the top surface 136a of the protective layer 136 and the top surfaces 134a of the die connectors 134 are substantially aligned with the top surface 140a of the first insulating layer 140 and the top surfaces 120a of the TIVs 120.

Figure 8C:
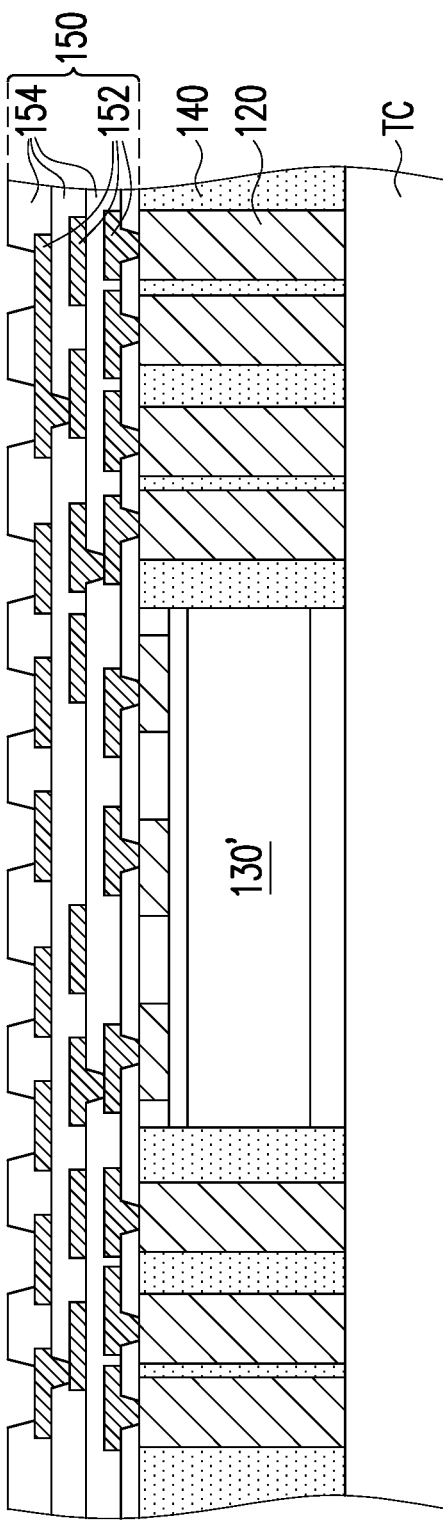
Figure 8D:
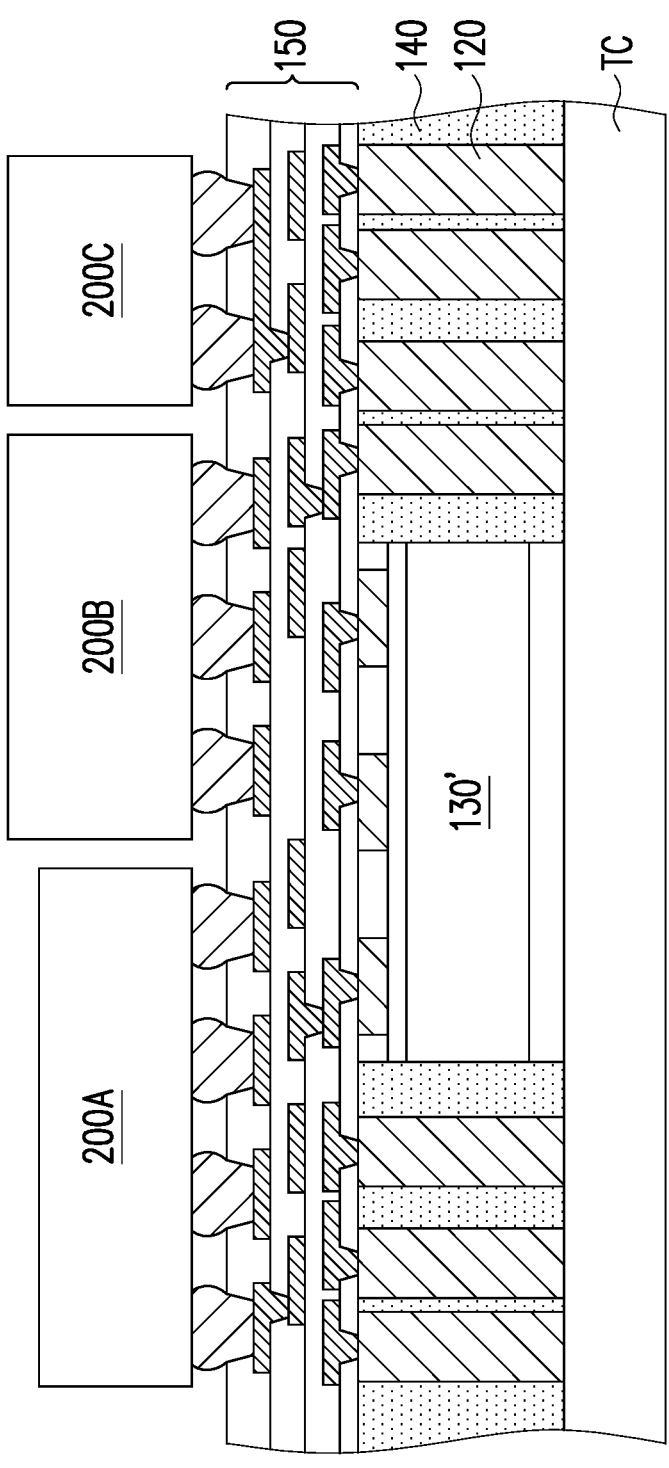

Referring to FIG. 8C and FIG. 8D, the second redistribution structure 150 including the second patterned conductive layer 152 and the second dielectric layer 154 is formed on the first insulating layer 140, the semiconductor die 130', and the TIVs 120. The second redistribution structure 150 is similar to the second redistribution structure 150 described in FIG. 1D, so the detailed descriptions are omitted for the sake of brevity. In some other embodiments, the second redistribution structure 150 is replaced with the second redistribution structure 350 shown in FIG. 4A. After forming the second redistribution structure 150, the device packages (200A, 200B, and 200C) may be disposed on the second redistribution structure 150, as shown in FIG. 8D. In some embodiments in which the semiconductor die 130' serves as the bridge die, the device packages (200A, 200B, and 200C) are in electrical communication with one another through the second redistribution structure 150 and the semiconductor die 130'. In other embodiments where the semiconductor die 130' includes active/passive components, the semiconductor die 130' is electrically coupled to the device packages (e.g., 200A, 200B, and 200C) through the second redistribution structure 150 to perform active/passive functions. The step of disposing the device packages may be similar to the step described in FIG. 1E.

Figure 8E:
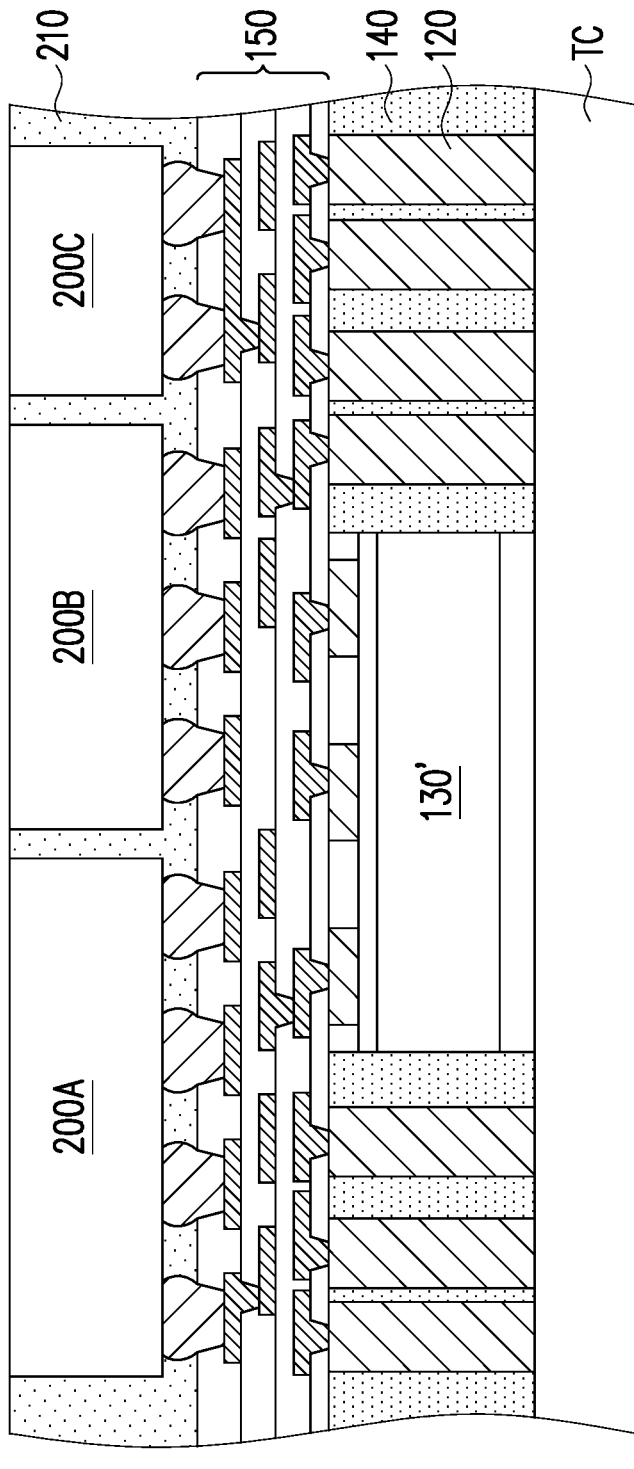

Referring to FIG. 8E, the second insulating layer 210 is formed on the second redistribution structure 150 to cover the device packages (200A, 200B, and 200C). The second insulating layer 210 may be or may include a molding underfill layer, the combination of an underfill and the molding compound, or the like. The forming process of the second insulating layer 210 may be similar to the process described in FIG. 1F, so the detailed descriptions are not repeated for the sake of brevity. In some embodiments, the device packages (200A, 200B, and 200C) are fully embedded in the second insulating layer 210 for protection. In other embodiments, the thickness of the second insulating layer 210 is less than the overall thickness of the respective device package, so that a portion of the device packages may be revealed by the second insulating layer 210. In some other embodiments, the top surfaces of the device packages (200A, 200B, and 200C) are substantially leveled with the top surfaces of the second insulating layer 210. For example, the device packages (200A, 200B, and 200C) are over-molded by the insulating material, and then the planarization process is performed on the insulating material to form the second insulating layer 210. In some embodiments, when performing the planarization process, a portion of the insulating material is removed together with a portion of the substrates of the device packages until the top surfaces of the second insulating layer 210 and the device packages are leveled.

Figure 8F:
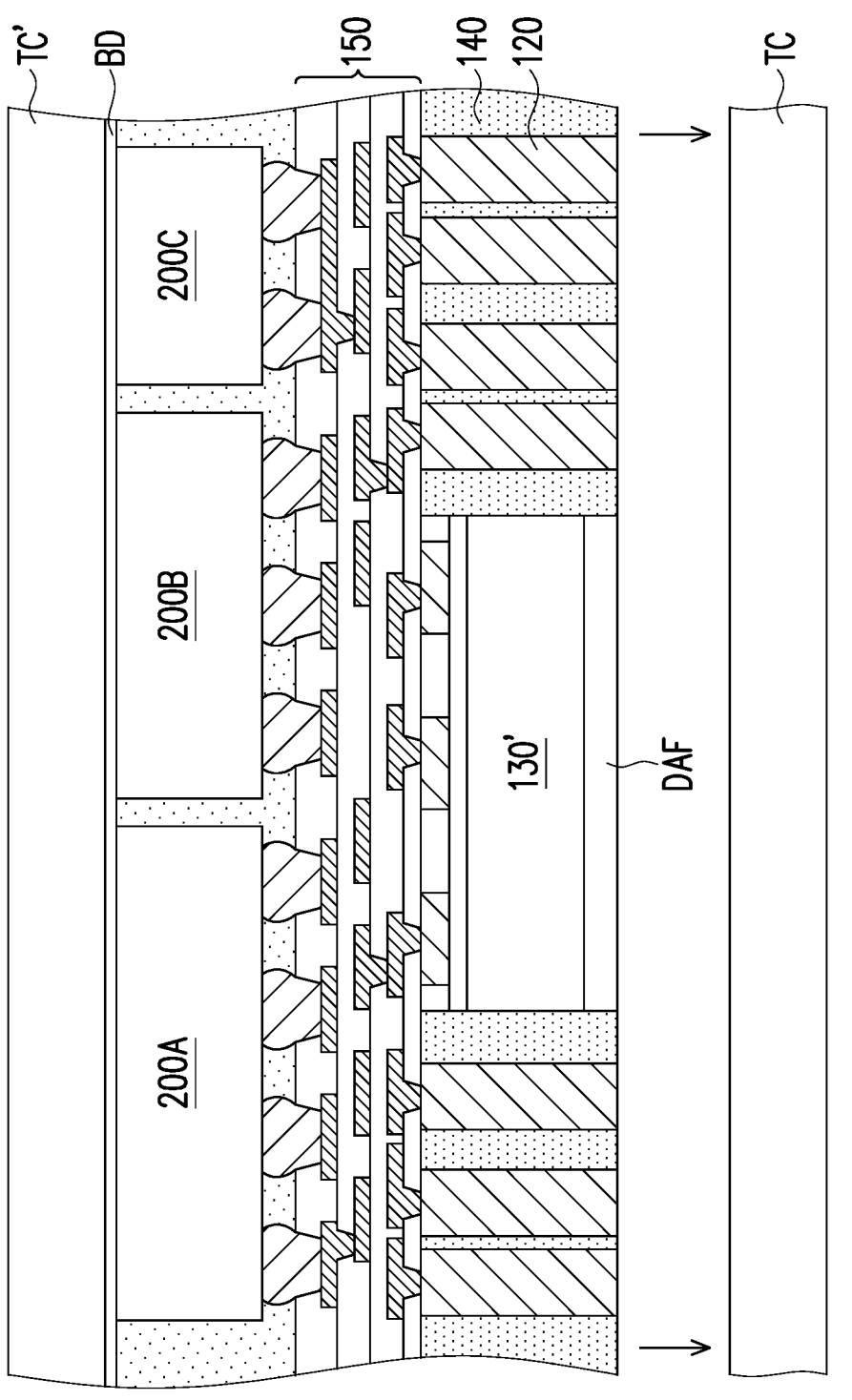

Referring to FIG. 8F, after forming the second insulating layer 210, an additional temporary carrier TC' may be disposed on the second insulating layer 210 opposite to the second redistribution structure 150. In some embodiments, the additional temporary carrier TC' is bonded to the second insulating layer 210 through a bonding layer BD. In some embodiments in which the top surfaces of the device packages (200A, 200B, and 200C) are revealed by the second insulating layer 210, the additional temporary carrier TC' may be attached to the top surfaces of the device packages (200A, 200B, and 200C) via the bonding layer BD. The bonding layer BD may be or may include a die attach film, the LTHC film, an adhesive, or the like. In some embodiments, the temporary carrier TC is de-bonded after bonding the additional temporary carrier TC'. Alternatively, the temporary carrier TC is removed prior to bonding the additional temporary carrier TC'.

Figure 8G:
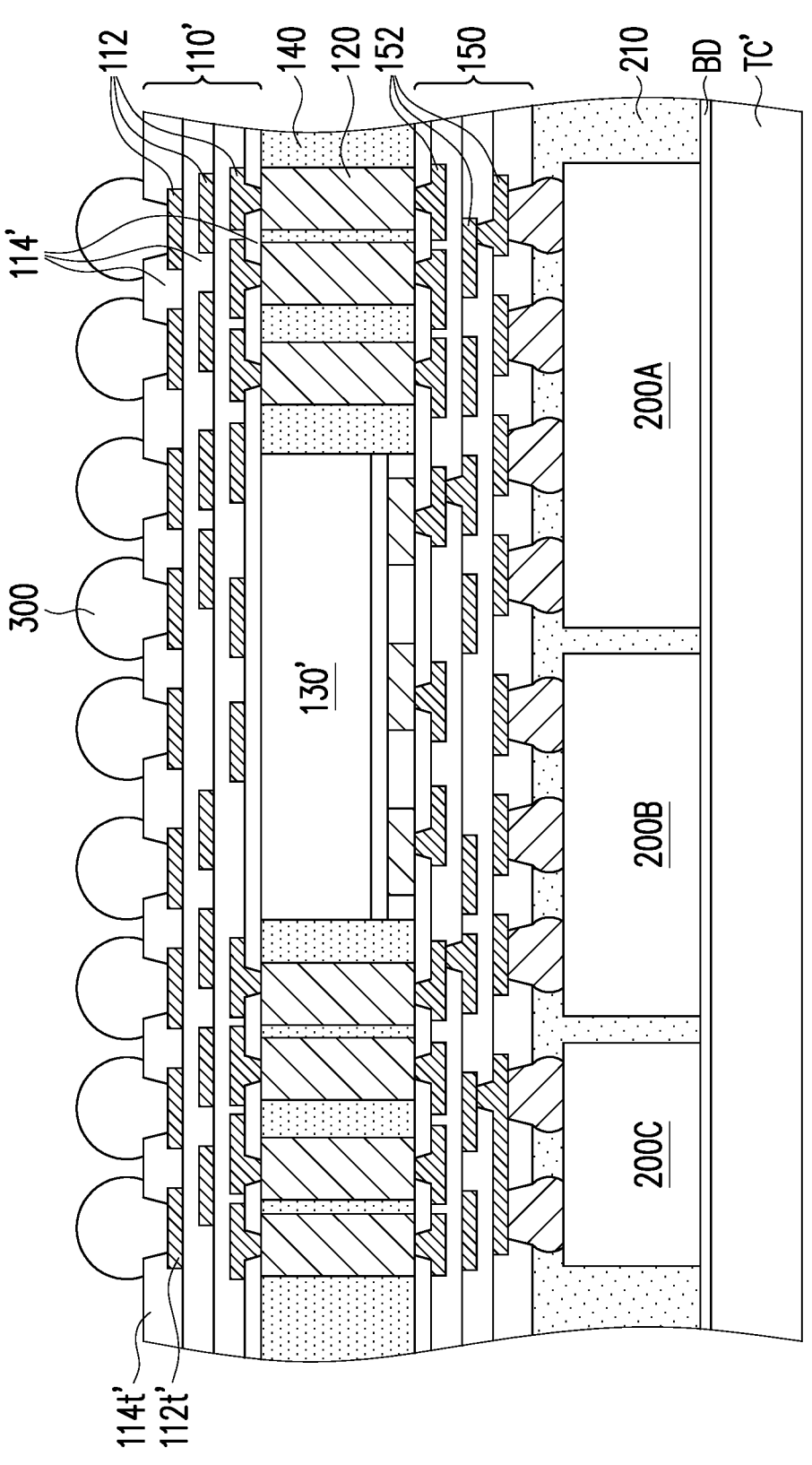

Referring to FIG. 8G, after removing the temporary carrier TC, the first redistribution structure 110' including the first patterned conductive layer 112 and the first dielectric layer 114' is formed on the first insulating layer 140 opposite to the second redistribution structure 150 to be electrically connected to the TIVs 120. For example, the structure is turned upside down so as to perform processes on the back side of the semiconductor die 130'. In some embodiments, the planarization process is performed before forming the first redistribution structure 110'. The die attach film DAF on the back surface of the semiconductor die 130' may be removed during the planarization process. The forming process of the first redistribution structure 110' is similar to the forming process of the second redistribution structure 150. In some embodiments, the via portion of the first patterned conductive layer 112 and the via portion of the second patterned conductive layer 152 are tapered toward each other.

Subsequently, the conductive terminals 300 are formed on the first redistribution structure 110'. The forming process of the conductive terminals 300 may be similar to the process described in FIG. 1G. In some embodiments, the topmost one 114t' of the first dielectric layer 114' includes a plurality of openings accessibly revealing at least a portion of the topmost one 112t' of the first patterned conductive layer 112, and the conductive terminals 300 may be formed in the openings of the topmost one 114t' of the first dielectric layer 114' to be in physical and electrical contact with the topmost one 112t' of the first patterned conductive layer 112.

Figure 8H:
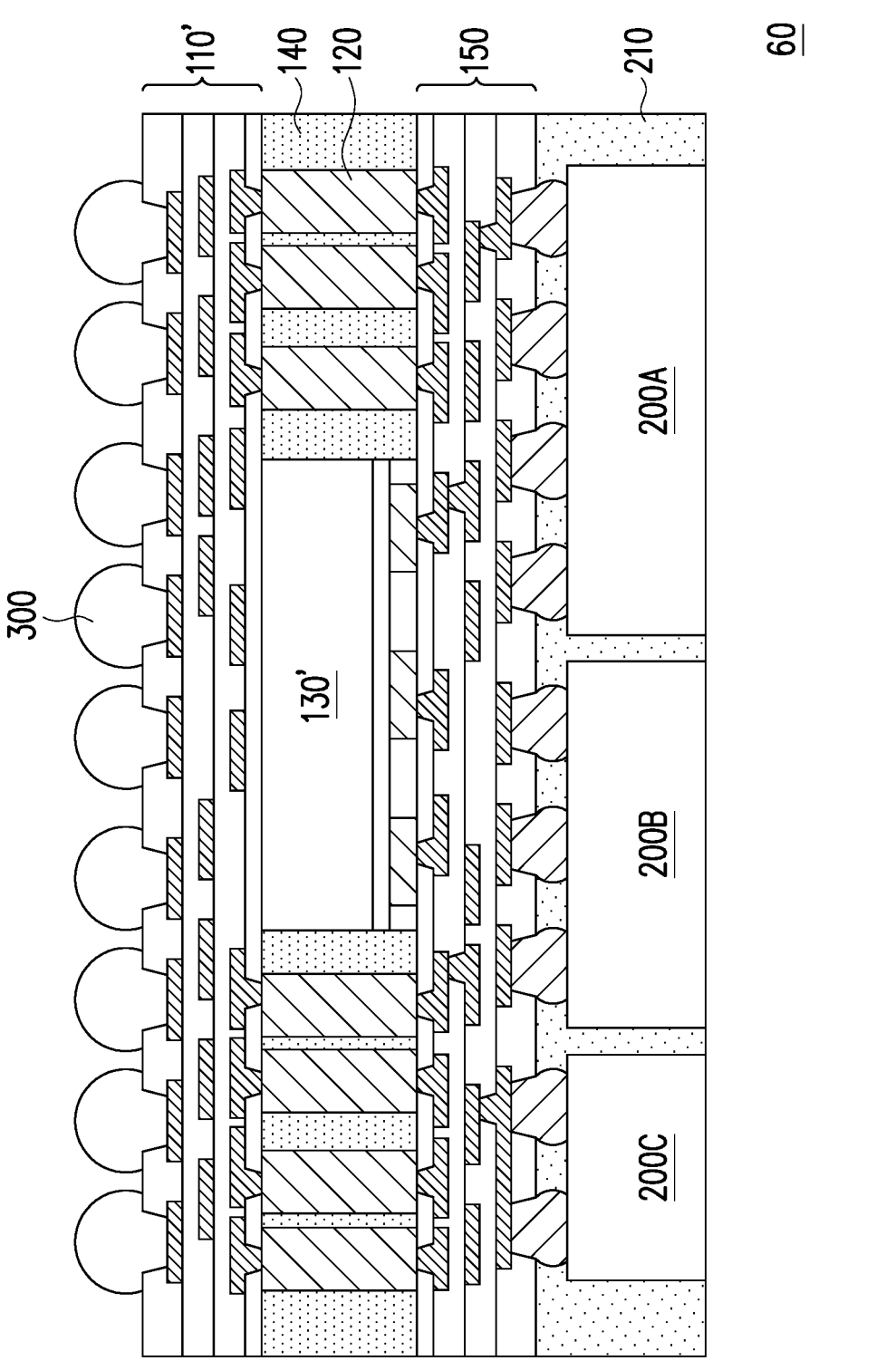

Referring to FIG. 8H, after forming the conductive terminals 300, the additional temporary carrier TC' is removed, and the singulation process is performed to form a plurality of electronic devices 60. The de-bonding process of the additional temporary carrier TC' and the singulation process may be similar to the processes described above, so the detailed descriptions are not repeated for the sake of brevity. The semiconductor die 130' of the electronic device 60 may be a bridge die which may be electrically coupled to the device packages (200A, 200B, and/or 200C) for communication between logic dies in the device packages (200A, 200B, and/or 200C) or between logic and memory dies in the device packages (200A, 200B, and/or 200C). In some embodiments, the semiconductor die 130' serving as a bridge die may be in electrical communication between function dies, where the function dies may be or may include a memory die, a processor die, a logic die, and/or a combination thereof, etc.

Figure 9A:
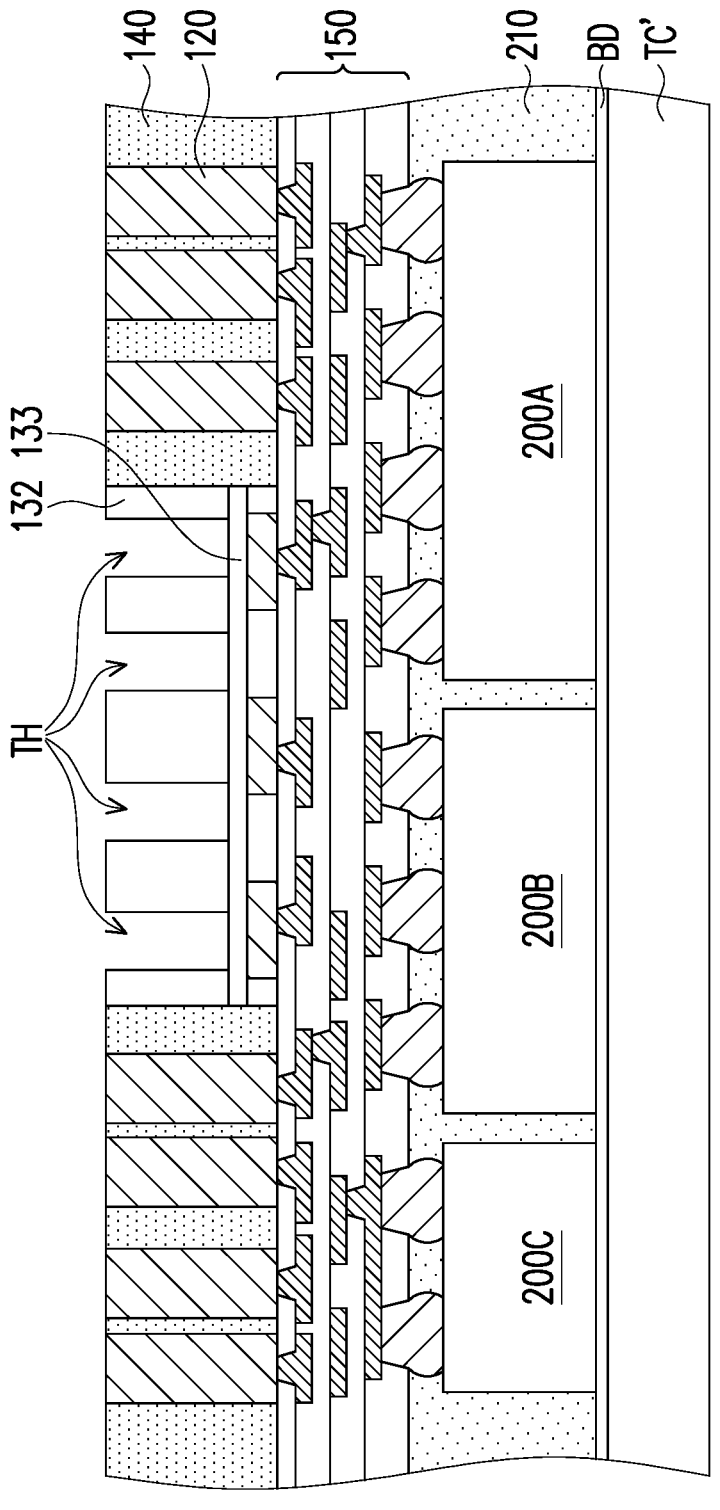
FIG. 9A and FIG. 9B are schematic cross-sectional views of various stages of manufacturing an electronic device in accordance with some embodiments of the disclosure.
Figure 9B:
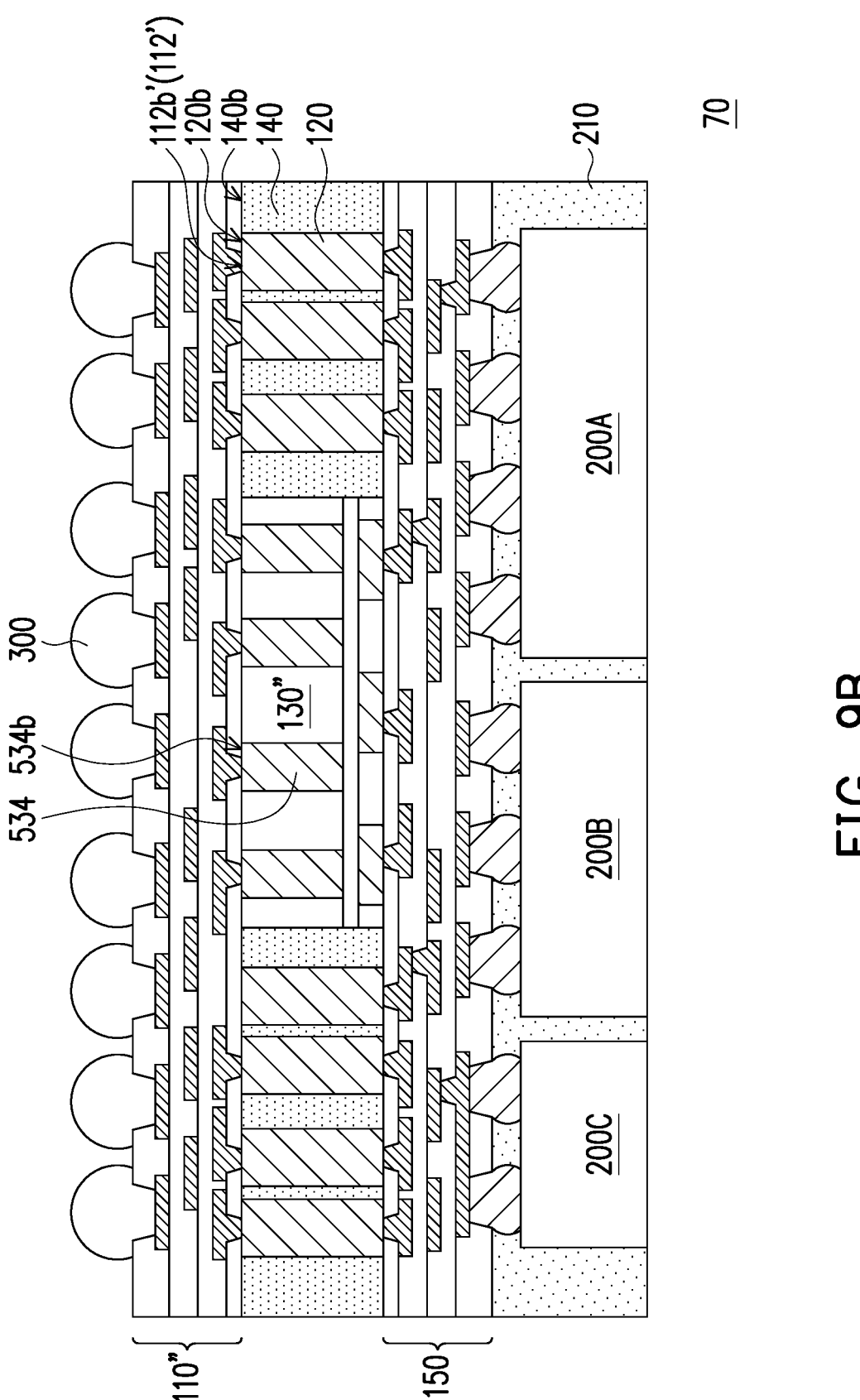

FIG. 9A and FIG. 9B are schematic cross-sectional views of various stages of manufacturing an electronic device in accordance with some embodiments of the disclosure. Throughout the various figures and discussion, like reference numbers refer to like components. Referring to FIG. 9A and FIG. 9B, the process of forming an electronic device 70 is similar to the forming process described in FIGS. 8A-8H. The difference between the electronic devices 60 and 70 includes that the semiconductor die 130" of the electronic device 70 includes the TSVs 534. In some embodiments, before forming the first redistribution structure 110' shown in FIG. 8G, at least one through hole TH is formed in the semiconductor substrate 132 to accessibly reveal at least a portion of the interconnecting layer 133. The forming process of the through holes TH may be similar to the process described in FIG. 6B, so the detailed descriptions are not repeated for the sake of brevity.

After forming the through holes TH, the conductive material may be formed in the through holes TH to form the TSVs 534 of the semiconductor die 130". In some embodiments, the planarization process is performed before forming the first redistribution structure 110' so that the bottom surfaces 120b of the TIVs 120 and the bottom surface 140b of the first insulating layer 140 may be substantially leveled with the bottom surfaces 534b of the TSVs 534. After forming the TSVs 534, the first redistribution structure 110" is formed, wherein the bottommost one 112b' of the first patterned conductive layer 112' may be in physical and electrical contact with the bottom surfaces 120b of the TIVs 120 and the top surfaces of the TSVs 534 of the semiconductor die 130". The following processes (e.g., forming the conductive terminals 300, de-bonding the additional temporary carrier TC', and singulation) may be similar to the processes described in FIGS. 8G and 8H, so the detailed descriptions are not repeated for the sake of brevity.

Figure 10A:
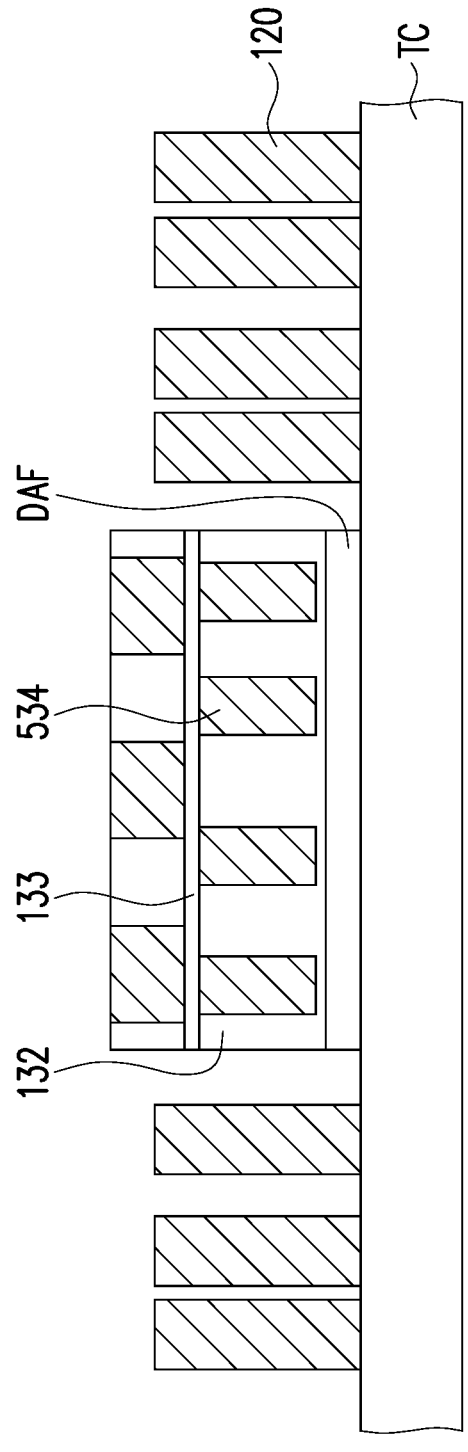
FIG. 10A and FIG. 10B are schematic cross-sectional views of various stages of manufacturing an electronic device in accordance with some embodiments of the disclosure.
Figure 10B:
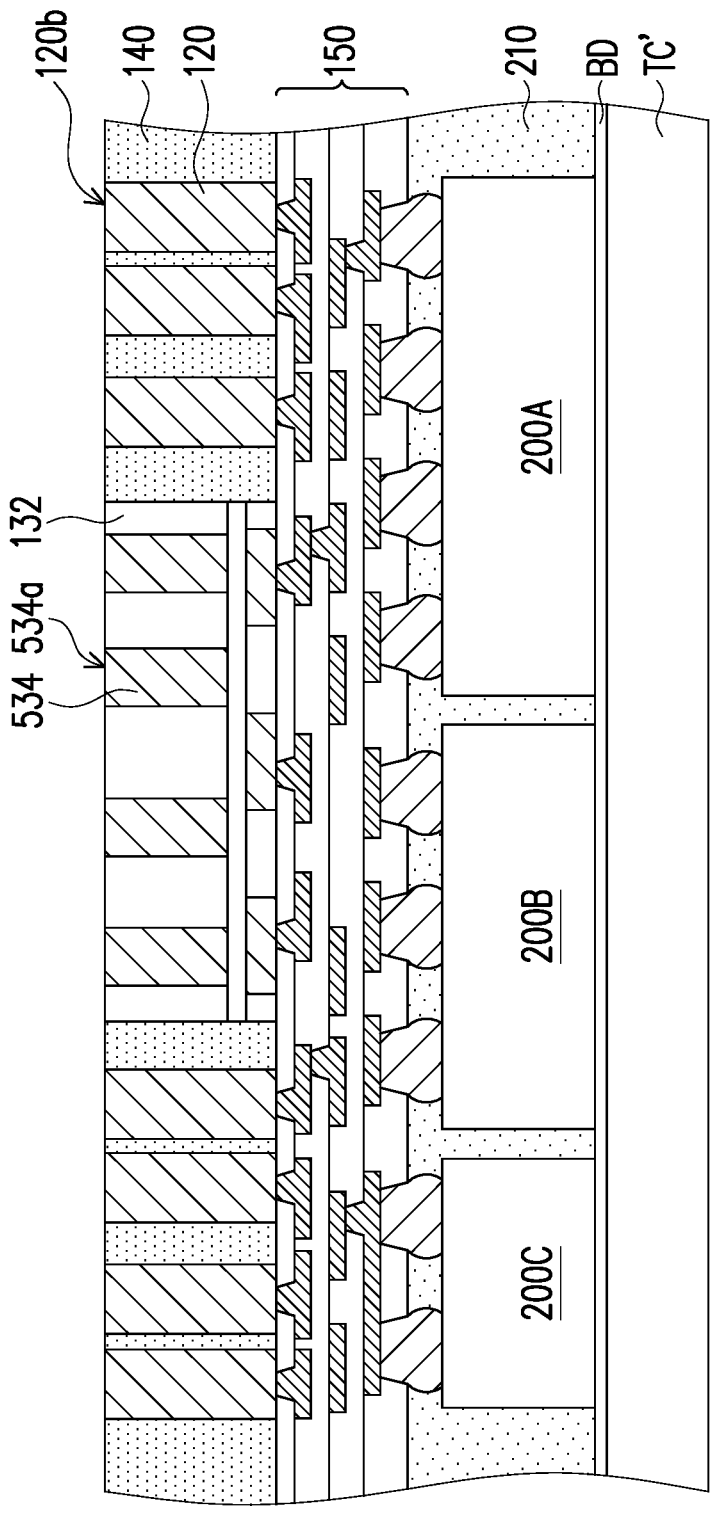

FIG. 10A and FIG. 10B are schematic cross-sectional views of various stages of manufacturing an electronic device in accordance with some embodiments of the disclosure. Throughout the various figures and discussion, like reference numbers refer to like components. Referring to FIG. 10A and FIG. 10B, the process of forming an electronic device is similar to the forming process described in FIGS. 8A-8H. The difference therebetween includes that the semiconductor die includes the TSVs 534 embedded inside the semiconductor substrate 132. In some embodiments, as shown in FIG. 10A, when disposing the semiconductor die on the temporary carrier TC, the TSVs 534 are not revealed. The die attach film DAF is optionally on the back surface of the semiconductor die 630. The following processes may be similar to the processes described in FIGS. 8B-8F, so the detailed descriptions are not repeated for the sake of brevity.

In some embodiments, after removing the temporary carrier TC, the planarization process is performed until at least a portion of the TSVs 534 is accessibly revealed by the semiconductor substrate 132. For example, after performing the planarization process, the bottom surfaces 534a of the TSVs 534 are substantially leveled with the bottom surfaces 120b of the TIVs 120. In some embodiments, the die attach film DAF shown in FIG. 10A is removed during the planarization process. The following processes (e.g., forming the first redistribution structure and the conductive terminals, de-bonding the additional temporary carrier TC', and singulation) may be similar to the processes described above. The resulting structure of the present embodiment may be the same as the electronic device 70 shown in FIG. 9B.

Figure 11A:
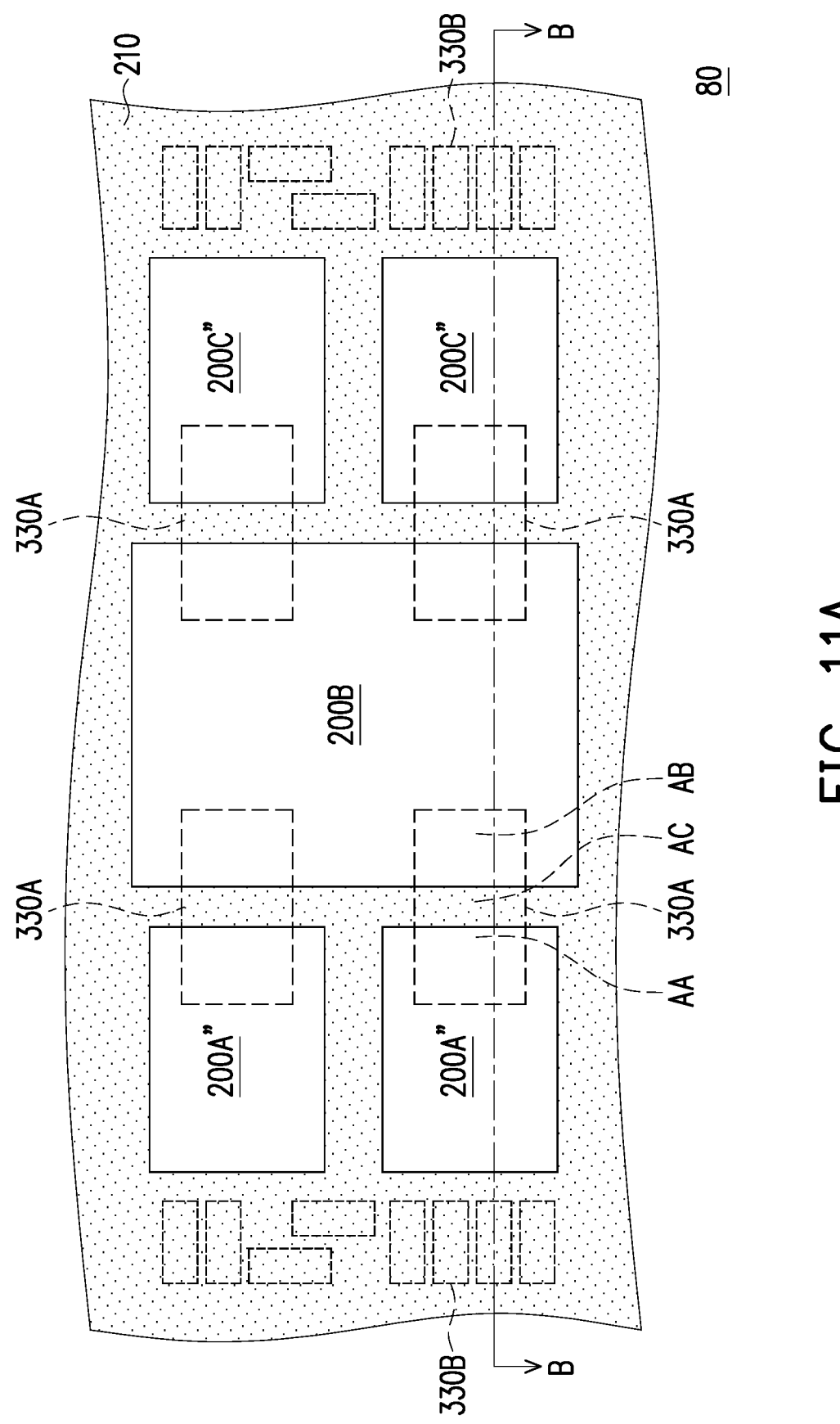
FIG. 11A is a schematic top view of an electronic device in accordance with some embodiments of the disclosure.
Figure 11B:
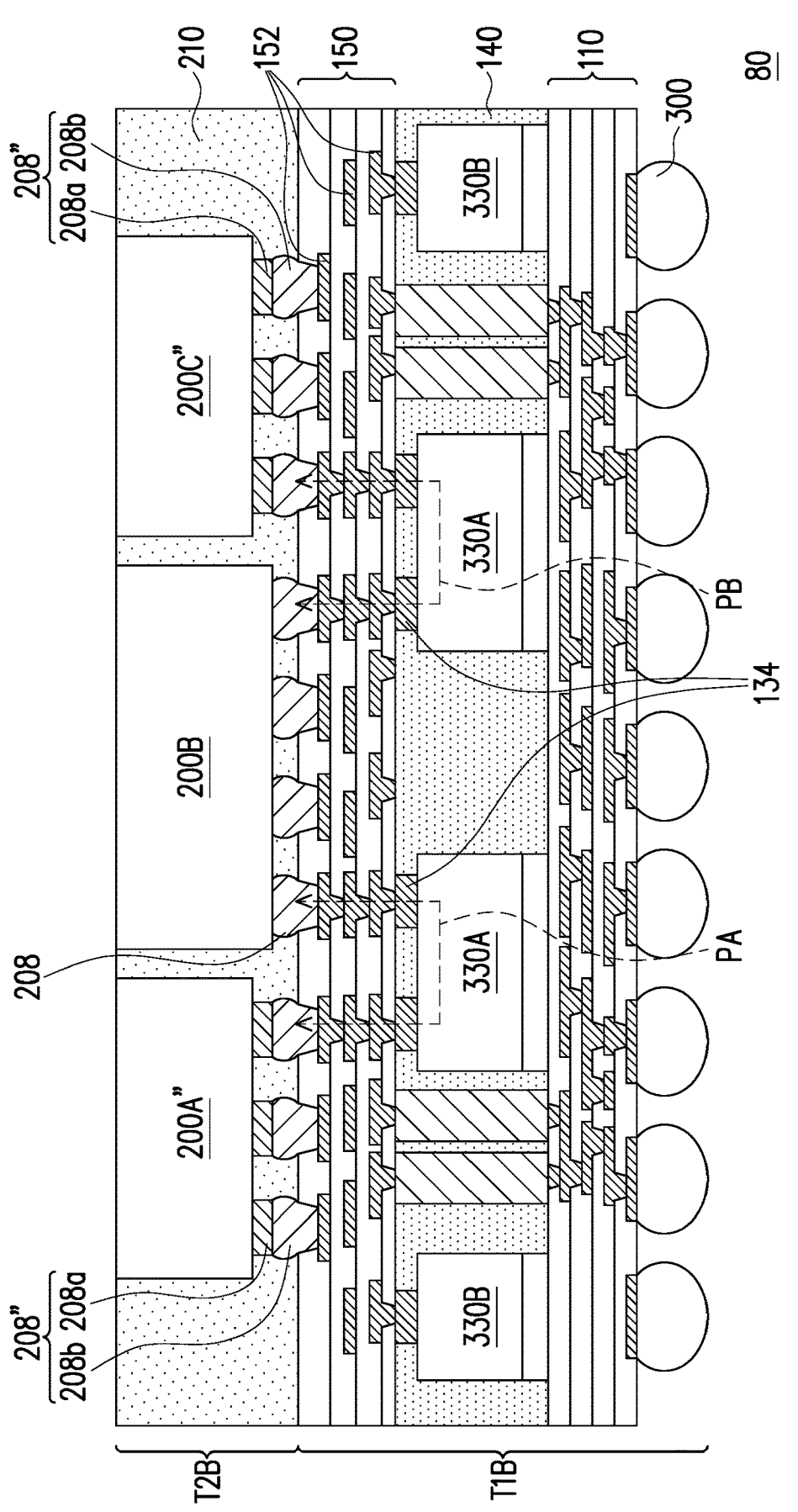
FIG. 11B is a schematic cross-sectional view taken along line B-B shown in FIG. 11A in accordance with some embodiments of the disclosure.

FIG. 11A is a schematic top view of an electronic device in accordance with some embodiments of the disclosure and FIG. 11B is a schematic cross-sectional view taken along line B-B shown in FIG. 11A in accordance with some embodiments of the disclosure. Throughout the various figures and discussion, like reference numbers refer to like components. Referring to FIG. 11A and FIG. 11B, an electronic device 80 including a first package component T1B and a second package component T2B is provided. The electronic device 80 may be fabricated using a similar process flow described above. It is noted that only device packages, the second insulating layer, and the semiconductor dies are illustrated in FIG. 11A, other features (e.g., redistribution structures, TIVs, conductive terminals, etc.) are not shown for ease of description. It is also noted that the semiconductor dies (330A and 330B) are shown in phantom in FIG. 11A to indicate that they are located at the first package component T1B.

The second package component T2B of the electronic device 80 includes at least one device package (e.g., 200A", 200B, and 200C") and the second insulating layer 210 covering the device package (e.g., 200A", 200B, and 200C"). For example, the top surface of the second insulating layer 210 is substantially leveled with the top surfaces of the device package (e.g., 200A", 200B, and 200C"). In other embodiments, the device package (e.g., 200A", 200B, and 200C") is fully covered by the second insulating layer 210. Alternatively, the second insulating layer 210 is replaced with the underfill layer 250 described in FIG. 3. A plurality of the device packages (200A", 200B, and 200C") may include the same type of device package or different types of device packages. In some embodiments, the electrical connectors 208 of the device package 200B are different from the electrical connectors 208" of the device packages (200A" and 200C"). For example, the respective electrical connector 208" includes a pillar portion 208a and a bump portion 208b connected the pillar portion 208a to the second redistribution structure 150. The pillar portions 208a and the bump portions 208b may be made of different conductive materials. For example, the pillar portions 208a include copper, copper alloy, etc., and the bump portions 208b include solder material. Other conductive materials such as tin, silver, nickel, gold, or the like, may be used to form the electrical connector 208" and/or the electrical connector 208.

The device packages (200A", 200B, and 200C") may each have a single function (e.g., a logic die, a memory die, etc.), or may have multiple functions (e.g., a system-on-chip (SoC) or the like). In some embodiments, the device package 200B may be associated with other device packages (200A" and 200C"). For example, the device package 200B may have one or multiple device packages (200A" and 200C") associated with it, and those device packages (200A" and 200C") are electrically connected to the device package 200B at least through the second redistribution structure 150. In some embodiments in which the first semiconductor dies functions as the bridge dies, the device package 200B is in electrical communication with the device packages (200A" and 200C") through the second redistribution structure 150 and the first semiconductor dies 330A. In some embodiments, the first semiconductor dies 330A are the bridge dies that function as interconnecting structures for the device packages (200A", 200B, and 200C") in the second package component T2B and provide shorter electrical connection paths (PA and PB) among the device packages (200A", 200B, and 200C").

The first semiconductor dies 330A may be similar to the semiconductor die 130 described in FIG. 1B. In some embodiments, in the top view shown as FIG. 11A, the first semiconductor die 330A is located at the positon that is between adjacent device packages, and extends across a portion of the second insulating layer 210 to partially cover the adjacent device packages. For example, in the top view shown as FIG. 11A, the orthographic projection area of the respective first semiconductor die 330A overlaps a peripheral portion AA of the device package 200A", a portion AC of the second insulating layer 210 between the device package 200A" and the device package 200B, and a peripheral portion AC of the device package 200B. It should be noted that the first semiconductor dies 330A disposed corresponding to two opposing sides of the device package 200B is an illustrative example, other configuration of the first semiconductor dies is possible, the configuration construes no limitation in the disclosure.

With the advancement of electronic technology, the device packages may become smaller in size with greater functionality and greater amounts of electrical connectors. The second patterned conductive layer 152 of the second redistribution structure 150 and the die connectors 134 of the first semiconductor dies 330A may be formed having greater density and fine line/spacing for matching electrical connector density of the device packages (200A", 200B, and 200C") so as to improve electrical and/or power performance. In some embodiments, the peripheral portion AA of the device package 200A" and/or the peripheral portion AC of the device package 200B are high connector density regions, the second patterned conductive layer 152 of the second redistribution structure 150 corresponding and connected to these high connector density regions is formed with fine line width and spacing. The semiconductor dies 330A connected to the second patterned conductive layer 152 that corresponds and connects these high connector density regions may also have fine line width and spacing and high connector density.

For example, the second patterned conductive layer 152 corresponding and connected to these high connector density regions may have the line width less than about 2 μm, and the spacing between adjacent conductive lines of the second patterned conductive layer 152 corresponding and connected to these high connector density regions may be less than about 2 μm. In some embodiments, the second patterned conductive layer 152 connected to these high connector density regions of the device packages (e.g., corresponding to the portions AA and AC) are formed with the line/spacing down to about 0.4 μm/0.4 μm. The semiconductor dies 330A connected to the second patterned conductive layer 152 with such line/spacing may include high connector density and may have the similar line/spacing for functioning as the bridge dies. For example, the density of the die connectors 134 of the respective first semiconductor die 330A substantially matches the density of the connectors of the device packages or the line/spacing requirements of the second patterned conductive layer 152. The electronic device 80 allows for fine pitched conductive lines of the second redistribution structure 150 and fine pitched connectors of the semiconductor dies 330A to be reliably formed therein.

In some embodiments, a second semiconductor die 330B is disposed in the first package component T1B and electrically coupled to at least one of the device packages (200A", 200B, 200C") through the second redistribution structure 150. For example, the second semiconductor die 330B is a die including passive components built therein. Other types or functions of semiconductor dies may be used. Alternatively, the second semiconductor die 330B is omitted. For example, a plurality of second semiconductor dies 330B is disposed on the periphery of the first insulating layer 140 of the first package component T1 as shown in the top view of FIG. 11A. In some embodiments, the second semiconductor dies 330B are disposed aside the first semiconductor dies 330A, and the TIVs 120 are located between the first semiconductor dies 330A and the second semiconductor dies 330B. For example, the TIVs 120 are arranged in a manner to surround the first semiconductor dies 330A, and the second semiconductor dies 330B are distributed at two opposing sides of the area defined by the TIVs 120. Other configurations of the TIVs 120 and the second semiconductor dies 330B are possible.

In some embodiments, in the top view shown as FIG. 11A, the orthographic projection areas of the second semiconductor dies 330B are completely apart from the device packages (200A", 200B, 200C"). In other embodiments, the orthographic projection areas of the second semiconductor dies 330B are at least partially overlap at least one of the device packages (e.g., 200A", 200B, 200C"). The number and the configuration of the second semiconductor die 330B shown herein are merely examples and construe no limitation in the disclosure.

Figure 12:
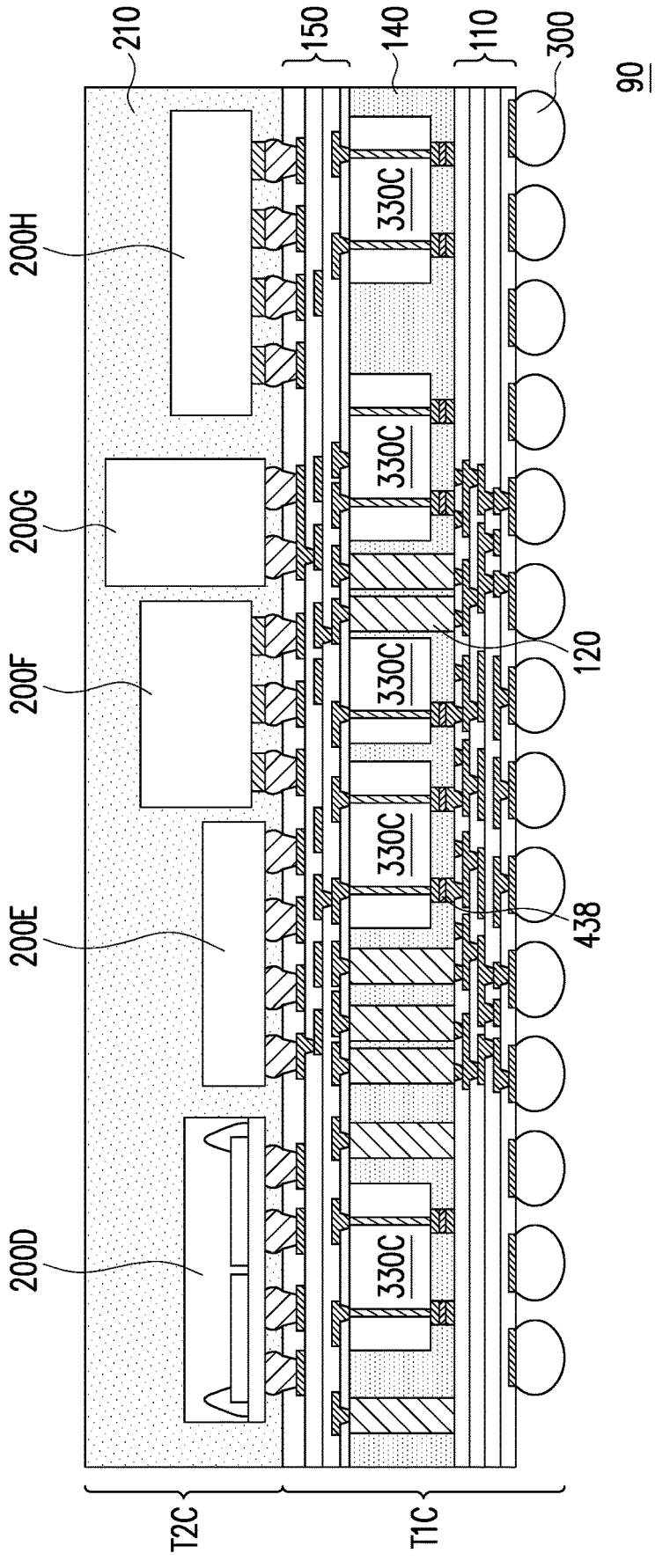
FIG. 12 is a schematic cross-sectional view of an electronic device in accordance with some embodiments of the disclosure.

FIG. 12 is a schematic cross-sectional view of an electronic device in accordance with some embodiments of the disclosure. Throughout the various figures and discussion, like reference numbers refer to like components. Referring to FIG. 12, an electronic device 90 including a first package component T1C and a second package component T2C is provided. The electronic device 90 may be fabricated using any suitable methods set forth above for manufacturing the electronic device.

In some embodiments, the first package component T1C includes a plurality of semiconductor dies 330C embedded in the first insulating layer 140. For example, the semiconductor dies 330C are disposed on the first redistribution structure 110 with the connections that includes solder material (e.g., the conductive bumps 438) for facilitating alignment of disposing the semiconductor dies 330C. In some embodiments, the semiconductor dies 330C are similar to the thinned semiconductor die 430 described in FIG. 5B. In other embodiments, the semiconductor dies 330C are similar to the semiconductor die 530 described in FIG. 6C. In other embodiments, the first package component T1C includes the semiconductor dies 330C, and the first semiconductor dies 330A and/or the second semiconductor dies 330B shown in FIG. 11B. For example, some of the semiconductor dies in the first package component includes the TSVs, and other semiconductor dies in the first package component may be free of the TSVs.

In some embodiments, the second package component T2C includes various types of device packages (e.g., 200D, 200E, 200F, 200G, 200H) mounted on the second redistribution structure 150 of the first package component T1C and encapsulated by the second insulating layer 210. In some embodiments, the second insulating layer 210 is replaced with the underfill layer 250 shown in FIG. 3. For example, the device packages includes a memory device package, passive device package, an integrated fan-out (InFO) package, and other 3DIC packages, etc. It is noted that the device packages (200D-200H) shown in FIG. 12 is an example that variations thereof may be carried out while still remaining within the disclosure.

In some embodiments, the first package component T1 is formed prior to the formation of the second package component T2. In other embodiments, the second package component T2 is formed prior to the formation of the first package component T1. In some embodiments, the electronic device 90 is mounted on a substrate board (not shown; e.g., substrate board 25 in FIG. 3), where the conductive terminals 300 may be physically and electrically connected to the substrate board to transfer the electrical signal to/from the electronic device 90.

According to some embodiments, a package structure includes a first patterned circuit layer (e.g., 112b) disposed on a carrier (e.g., 25); a first dielectric layer (e.g., 114b) on the first patterned circuit layer; a first conductive via (e.g., 112 on the 112b) disposed in the first dielectric layer and electrically connected to the first patterned circuit layer; a circuit layer (e.g., pads in 114t) disposed on the first dielectric layer; a second dielectric layer (e.g., 114t) disposed on the first dielectric layer and covering the circuit layer; a second patterned circuit layer disposed on the second dielectric layer; a chip (e.g., 130); and a molding layer (e.g., 140) on the second dielectric layer and encapsulating the chip. The circuit layer includes a plurality of portions (e.g., pads in 114t) separated from each other, the portions includes a first portion (e.g., pads in 114t and directly underneath 130) and a second portion (e.g., pads in 114t and directly underneath 140), where the number of pads corresponding to the first portion is different from the number of pads corresponding to the second portion. The second patterned circuit layer includes conductive features (e.g., 112t), an orthographic projection of each of the portions on the carrier overlaps orthographic projections of at least two of the conductive features of the second patterned circuit layer on the carrier. The chip is disposed on the conductive features.

According to some embodiments, a package structure includes a chip (e.g., 130) laterally covered by a molding layer (e.g., 140) and a first redistribution structure (e.g., 110) disposed on a back side (e.g., 130b) of the chip. The first redistribution structure includes a circuit layer (e.g., pads in 114t) and conductive features (e.g., 112t) landing on the circuit layer and directly underneath the chip. The circuit layer includes conductive pads separated from each other, the conductive pads include a first portion (e.g., pads in 114t and directly underneath 130) and a second portion (e.g., pads in 114t and directly underneath 140), where the pad number of the first portion is different from the pad number the second portion. An orthographic projection of each of the conductive pads of the circuit layer overlaps orthographic projections of at least two of the conductive features.

According to some embodiments, a package structure includes a first package component (e.g., T1) disposed over and electrically coupled to a circuit carrier (e.g., 25). The first package component includes a chip (e.g., 130) laterally covered by a molding layer (e.g., 140); a first redistribution structure (e.g., 110) disposed on a back side (e.g., 130b) of the chip; and a second redistribution structure (e.g., 150) disposed on an active side (e.g., 130a) of the chip. The first redistribution structure includes a circuit layer (e.g., pads in 114t) and conductive vias (e.g., 112t). The circuit layer includes first conductive pads underneath the chip and second conductive pads underneath the molding layer, where the number of the first conductive pads is different from the second conductive pads. The conductive features land on the circuit layer and are directly underneath the chip, where an orthographic projection of each of the conductive pads of the circuit layer overlaps orthographic projections of at least two of the conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first patterned circuit layer disposed on a carrier;
   a first dielectric layer disposed on the first patterned circuit layer;
   a first conductive via disposed in the first dielectric layer and electrically connected to the first patterned circuit layer;
   a circuit layer disposed on the first dielectric layer, the circuit layer comprising a plurality of portions separated from each other, the portions comprising a first portion and a second portion, wherein the number of pads corresponding to the first portion is different from the number of pads corresponding to the second portion;
   a second dielectric layer disposed on the first dielectric layer and covering the circuit layer;
   a second patterned circuit layer disposed on the second dielectric layer and comprising conductive features, wherein an orthographic projection of each of the portions on the carrier overlaps orthographic projections of at least two of the conductive features of the second patterned circuit layer on the carrier;

a chip disposed on the conductive features; and a molding layer disposed on the second dielectric layer and encapsulating the chip.

2. The package structure of claim 1, further comprising:

a second conductive via disposed in the second dielectric layer and electrically connected to the circuit layer.

3. The package structure of claim 2, wherein at least one of the portions is electrically connected to the first conductive via and the second conductive via, and the chip is electrically connected to the second conductive via at least through the pads.

4. The package structure of claim 1, further comprising:

conductive terminals coupling the first patterned circuit layer to the carrier, wherein a corresponding one of the conductive terminals and the first conductive via are disposed at two opposing sides of the first patterned circuit layer.

5. The package structure of claim 1, wherein the first portion of the portions is distributed directly underneath the chip.

6. The package structure of claim 1, wherein the conductive features of the second patterned circuit layer are vias, and wider ends of the vias are in direct contact with a die attach film disposed on a back side of the chip.

7. The package structure of claim 1, further comprising:

through interlayer via passing through the molding layer and disposed directly over the second portion of the portions, wherein the chip is electrically coupled to the through interlayer via.

8. The package structure of claim 1, further comprising:

a third dielectric layer disposed on the chip and the molding layer, wherein the third dielectric layer and the second dielectric layer are disposed at two opposing sides of the chip; and a third conductive via disposed in the third dielectric layer and directly landing on an active side of the chip.

9. The package structure of claim 8, further comprising:

a device package disposed over the third dielectric layer, the device package being electrically coupled to the chip at least through the third conductive via.

10. The package structure of claim 8, further comprising:

a support ring disposed over the third dielectric layer, wherein the device package is surrounded by the support ring, and the support ring is electrically floating in the package structure.

11. The package structure of claim 8, wherein the first, second, and third conductive vias are tapered in a direction from the active side of the chip toward a back side of the chip.

12. The package structure of claim 8, wherein the first dielectric layer, the second dielectric layer, the third dielectric layer, and the molding layer have a same width.

13. A package structure, comprising:

a chip laterally covered by a molding layer; and a first redistribution structure disposed on a back side of the chip, the first redistribution structure comprising:

a circuit layer comprising conductive pads separated from each other, the conductive pads comprising a first portion and a second portion, wherein the pad number of the first portion is different from the pad number the second portion; and conductive features landing on the circuit layer and directly underneath the chip, wherein an orthographic projection of each of the conductive pads of the circuit layer overlaps orthographic projections of at least two of the conductive features.

14. The package structure of claim 13, wherein the first redistribution structure further comprises:

a bottommost dielectric layer; and a bottommost circuit layer below and electrically connected to the circuit layer, the bottommost circuit layer comprising contact pads, an outermost surface of each of the contact pads being leveled with an outermost surface of the bottommost dielectric layer.

15. The package structure of claim 14, further comprising:

circuit carrier disposed below the first redistribution structure;

conductive terminals coupling the outermost surfaces of the contact pads to the circuit carrier.

16. The package structure of claim 13, wherein the first redistribution structure further comprises:

a topmost dielectric layer laterally covering the circuit layer and the conductive features, wherein an outermost surface of the topmost dielectric layer is leveled with outermost surfaces of the conductive features.

17. The package structure of claim 13, wherein the conductive features are vias tapering from the back side of the chip toward the conductive pads of the circuit layer.

18. The package structure of claim 13, further comprising:

a second redistribution structure disposed on an active side of the chip and the molding layer, wherein vias of the second redistribution structure are tapered toward the active side of the chip.

19. A package structure, comprising:

a first package component disposed over and electrically coupled to a circuit carrier and comprising:

a chip laterally covered by a molding layer;

a first redistribution structure disposed on a back side of the chip and comprising:

a circuit layer comprising first conductive pads underneath the chip and second conductive pads underneath the molding layer, wherein the number of the first conductive pads is different from the second conductive pads; and conductive vias landing on the first conductive pads, wherein more than one of the conductive vias lands on one of the first conductive pads;

a second redistribution structure disposed on an active side of the chip, and;

a second package component disposed on and electrically coupled to the first package component and comprising:

a device package disposed on and electrically coupled to the second redistribution structure;

a support ring attached to the second redistribution structure, wherein the device package is surrounded by the support ring, and the support ring is electrically floating in the second package component.

20. The package structure of claim 19, wherein further comprising:

through interlayer via passing through the molding layer, wherein the chip is electrically coupled to the through interlayer via.

* * * * *